(12) United States Patent
Mitsugi et al.

(10) Patent No.: US 9,130,134 B2
(45) Date of Patent: Sep. 8, 2015

(54) SEMICONDUCTOR LIGHT EMITTING DEVICE AND METHOD FOR MANUFACTURING SAME

(71) Applicant: Kabushiki Kaisha Toshiba, Tokyo (JP)

(72) Inventors: Satoshi Mitsugi, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,304

(22) Filed: Feb. 28, 2013

(65) Prior Publication Data

US 2014/0084316 A1 Mar. 27, 2014

(30) Foreign Application Priority Data

Sep. 21, 2012 (JP) .................................. 2012-208568

(51) Int. Cl.
*H01L 33/00* (2010.01)
*H01L 33/60* (2010.01)
*H01L 33/10* (2010.01)
*H01L 33/08* (2010.01)

(52) U.S. Cl.
CPC .............. *H01L 33/60* (2013.01); *H01L 33/005* (2013.01); *H01L 33/10* (2013.01); *H01L 33/08* (2013.01)

(58) Field of Classification Search
CPC ....... H01L 33/22; H01L 33/60; H01L 33/005; H01L 33/10; H01L 33/08
USPC ........................................ 257/76, 88, 98, 432
See application file for complete search history.

(56) References Cited

U.S. PATENT DOCUMENTS

2009/0159908 A1* 6/2009 David et al. ..................... 257/95
2011/0303938 A1* 12/2011 Uemura et al. .................. 257/98

FOREIGN PATENT DOCUMENTS

| JP | 50-105286 | 8/1975 |
|----|-----------|--------|
| JP | 51-18788 | 2/1976 |
| JP | 4-63478 A | 2/1992 |
| JP | 2002-26386 | 1/2002 |

(Continued)

OTHER PUBLICATIONS

Japanese Office Action Issued Apr. 22, 2013 in Patent Application No. 2012-208568 (with English translation).

(Continued)

*Primary Examiner* — Jae Lee
*Assistant Examiner* — Mohammed R Alam
(74) *Attorney, Agent, or Firm* — Oblon, McClelland, Maier & Neustadt, L.L.P.

(57) ABSTRACT

According to one embodiment, a semiconductor light emitting device includes: a stacked body and an insulative optical path control section. The stacked body includes: a first semiconductor layer of a first conductivity type; a second semiconductor layer of a second conductivity type; and a light emitting layer provided between the first semiconductor layer and the second semiconductor layer. The first semiconductor layer, the second semiconductor layer, and the light emitting layer are stacked along a stacking direction. The insulative optical path control section penetrates through the second semiconductor layer and the light emitting layer, has a refractive index lower than refractive index of the first semiconductor layer, refractive index of the second semiconductor layer, and refractive index of the light emitting layer. The insulative optical path control section is configured to change traveling direction of light emitted from the light emitting layer.

12 Claims, 18 Drawing Sheets

(56) References Cited

FOREIGN PATENT DOCUMENTS

| | | |
|---|---|---|
| JP | 2002-164574 | 6/2002 |
| JP | 2002-353497 A | 12/2002 |
| JP | 2003-101065 A | 4/2003 |
| JP | 2004-505434 | 2/2004 |
| JP | 2005-286291 A | 10/2005 |
| JP | 2007-149875 | 6/2007 |
| JP | 2007-189242 A | 7/2007 |
| JP | 2007-227939 | 9/2007 |
| JP | 2008-10894 A | 1/2008 |
| JP | 2010-278224 A | 12/2010 |
| JP | 2011-29612 A | 2/2011 |
| WO | WO 2008/047923 | 4/2008 |

OTHER PUBLICATIONS

Notification of Reason(s) for Refusal issued Aug. 27, 2013 in Japanese Patent Application No. 2012-208568 (with English translaiton).

I. Schnitzer, et al., "30% external quantum efficiency from surface textured, thin-film light-emitting diodes", Applied Physics Letters, vol. 63, No. 16, Oct. 18, 1993, pp. 2174-2176.

Susumu Noda, et al.,"Photonic crystal efficiency boost", Nature Photonics, vol. 3, Mar. 2009, pp. 129-130.

M. Francardi, et al., "Enhanced spontaneous emission in a photonic-crystal light-emitting diode", Applied Physics Letters, vol. 93, 2008, pp. 143102-1 to 143102-3.

Chin-Hsiang Chen, "InGaN/GaN blue light emitting diodes with modulation-doped AlGaN/GaN heterostructure layers", Journal of Vacuum Science and Technology A., vol. 24, No. 4, Jul./Aug. 2006, pp. 1001-1004.

Jae-Hoon Lee, et al., "Enhanced Output Power of InGaN-Based Light-Emitting Diodes With AlGaN/GaN Two-Dimensional Electron Gas Structure", IEEE Electron Device Letters, vol. 31, No. 5, May 2010, pp. 455-457.

Office Action mailed Oct. 30, 2014 in Japanese Application No. 2013-223731 (w/English translation).

Office Action mailed Apr. 7, 2015 in Japanese Application No. 2013-223731 (w/English translation).

* cited by examiner

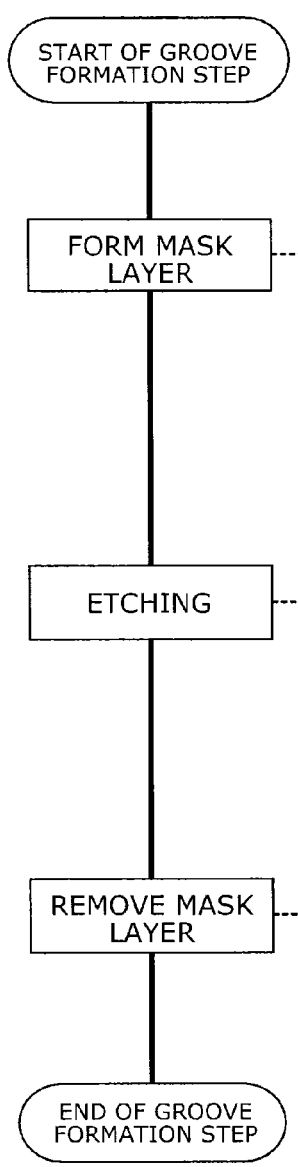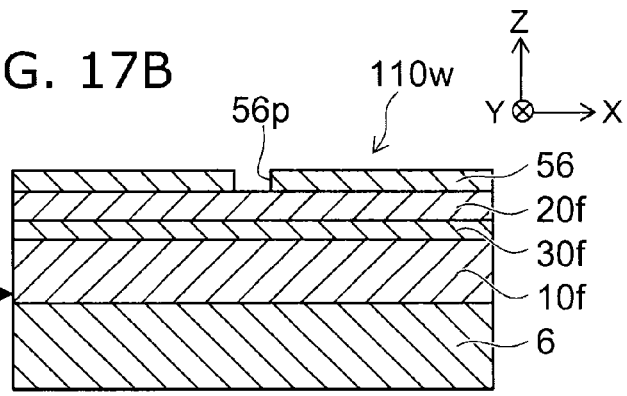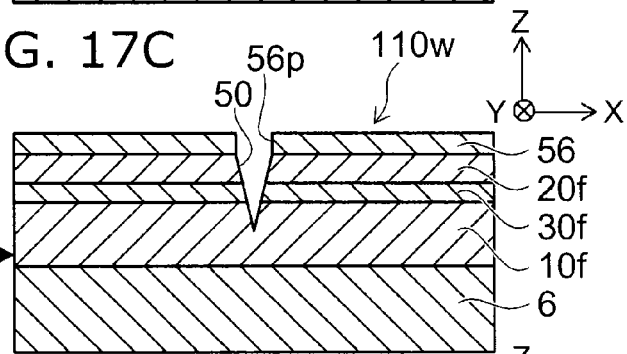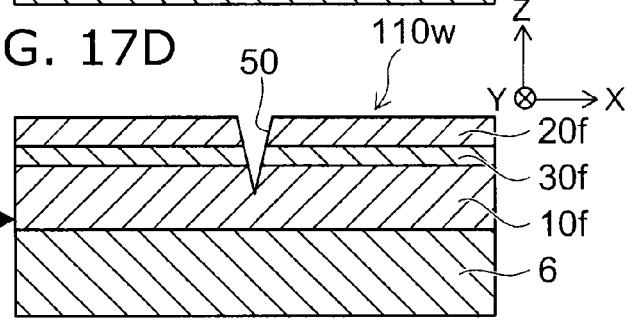

FIG. 18A
( START OF LIGHT SCATTERING SECTION FORMATION STEP )
FORM PROTECTIVE LAYER
PATTERNING
COMPOSITION MODIFICATION PROCESSING
REMOVE PROTECTIVE LAYER
( END OF LIGHT SCATTERING SECTION FORMATION STEP )
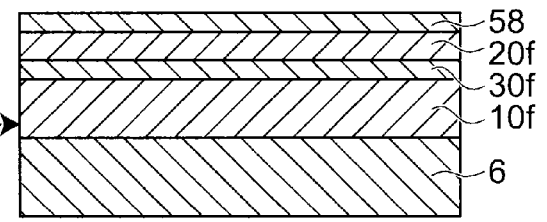
FIG. 18B
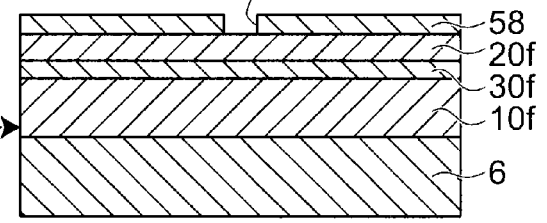
FIG. 18C
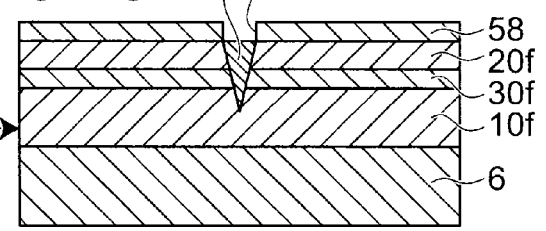
FIG. 18D
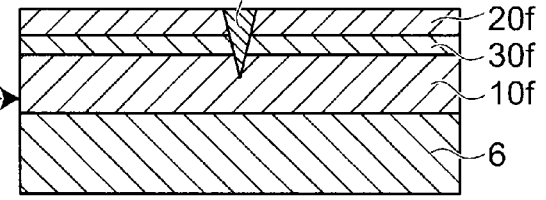
FIG. 18E

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2012-208568, filed on Sep. 21, 2012; the entire contents of which are incorporated herein by reference.

FIELD

Embodiments described herein relate generally to a semiconductor light emitting device and method for manufacturing same.

BACKGROUND

Semiconductor light emitting devices such as light emitting diodes are known. In a configuration of the semiconductor light emitting device, the light emitting layer is divided into a plurality of regions, and a gap is provided between the regions. In this configuration, light traveling generally parallel to the film surface of the light emitting layer is totally reflected by the gap portion. This can increase the light extraction efficiency. However, in the configuration of dividing the light emitting layer into a plurality of regions, the area of the light emitting layer is decreased relative to the area of the entire device. Thus, there is demand for increasing the light extraction efficiency while suppressing the decrease of the area of the light emitting layer.

BRIEF DESCRIPTION OF THE DRAWINGS

FIGS. 17A to 17D are a flow chart and schematic sectional views illustrating an alternative method for manufacturing part of the semiconductor light emitting device according to the embodiment;

FIGS. 18A to 18E are a flow chart and schematic sectional views illustrating an alternative method for manufacturing part of the semiconductor light emitting device according to the embodiment;

DETAILED DESCRIPTION

Figure 1A:
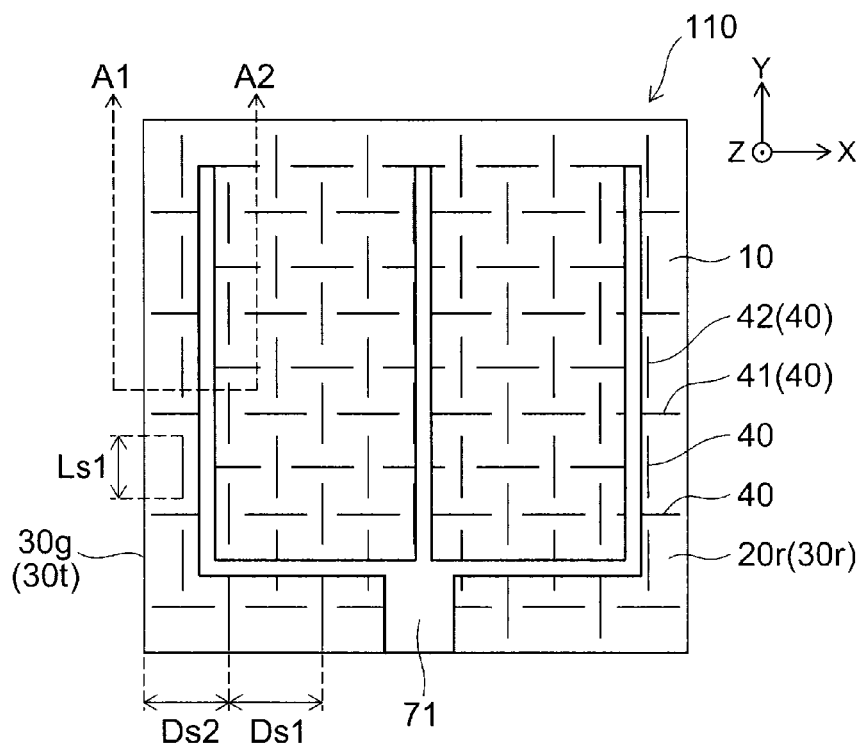
FIGS. 1A and 1B are schematic views showing a semiconductor light emitting device according to an embodiment.

In general, according to one embodiment, a semiconductor light emitting device includes: a stacked body and an insulative optical path control section. The stacked body includes: a first semiconductor layer of a first conductivity type; a second semiconductor layer of a second conductivity type; and a light emitting layer provided between the first semiconductor layer and the second semiconductor layer. The first semiconductor layer, the second semiconductor layer, and the light emitting layer are stacked along a stacking direction. The insulative optical path control section penetrates through the second semiconductor layer and the light emitting layer, has a refractive index lower than refractive index of the first semiconductor layer, refractive index of the second semiconductor layer, and refractive index of the light emitting layer. The insulative optical path control section is configured to change traveling direction of light emitted from the light emitting layer.

In general, according to another embodiment, a method for manufacturing a semiconductor light emitting device is provided. The method includes: preparing a workpiece including: a substrate; a first semiconductor film of a first conductivity type provided on the substrate; a light emitting film provided on the first semiconductor film; and a second semiconductor film of a second conductivity type provided on the light emitting film; and forming in the workpiece an insulative optical path control section penetrating through the second semiconductor film and the light emitting film, having a refractive index lower than refractive index of the first semiconductor film, refractive index of the second semiconductor film, and refractive index of the light emitting film, and configured to change traveling direction of light emitted from the light emitting film.

Embodiments will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

Figure 1B:
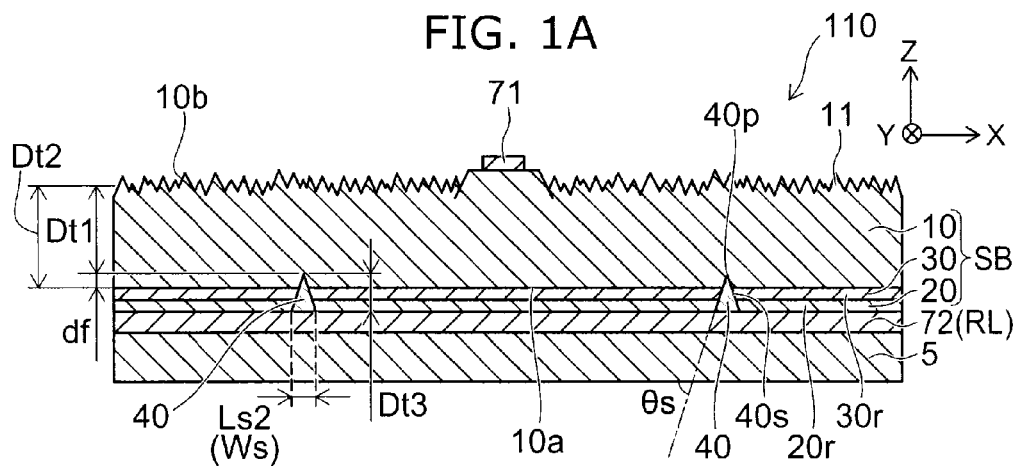

FIGS. 1A and 1B are schematic views showing a semiconductor light emitting device according to an embodiment.

FIG. 1A is a schematic plan view. FIG. 1B is a schematic sectional view showing a cross section taken along line A1-A2 of FIG. 1A.

As shown in FIGS. 1A and 1B, the semiconductor light emitting device 110 according to this embodiment includes a stacked body SB and an optical path control section 40.

The stacked body SB includes a first semiconductor layer 10, a light emitting layer 30, and a second semiconductor layer 20.

The first semiconductor layer 10 includes a nitride semiconductor and is of the first conductivity type. The first conductivity type is n-type, and the second conductivity type is p-type. Alternatively, the first conductivity type may be p-type, and the second conductivity type may be n-type. In the following description, it is assumed that the first conductivity type is n-type, and the second conductivity type is p-type. The first semiconductor layer 10 is e.g. a GaN layer containing n-type impurity. The n-type impurity of the first semiconductor layer 10 is e.g. Si.

The second semiconductor layer 20 includes a nitride semiconductor and is of the second conductivity type. The second semiconductor layer 20 is e.g. a GaN layer containing p-type impurity. The p-type impurity of the second semiconductor layer 20 is e.g. Mg. The thickness (length along the Z-axis direction) of the second semiconductor layer 20 is thinner than the thickness of the first semiconductor layer 10.

The light emitting layer 30 is provided between the first semiconductor layer 10 and the second semiconductor layer 20. The first semiconductor layer 10, the second semiconductor layer 20, and the light emitting layer 30 are stacked along the stacking direction. Here, the stacking direction of the first semiconductor layer 10 and the second semiconductor layer 20 is referred to as Z-axis direction. The Z-axis direction is the direction perpendicular to the film surface of the first semiconductor layer 10. One direction perpendicular to the Z-axis direction is referred to as X-axis direction. The direction perpendicular to the Z-axis direction and the X-axis direction is referred to as Y-axis direction.

The light emitting layer 30 includes e.g. a nitride semiconductor. The light emitting layer 30 has e.g. an MQW (multi-quantum well) structure in which a plurality of barrier layers and a plurality of well layers are alternately stacked along the Z-axis direction. Alternatively, the light emitting layer 30 may have an SQW (single-quantum well) structure. That is, each of the barrier layer and the well layer may be single. The barrier layer is e.g. a GaN layer. The well layer is e.g. an InGaN layer.

A voltage is applied between the first semiconductor layer 10 and the second semiconductor layer 20 to pass a current in the light emitting layer 30. Thus, light is emitted from the light emitting layer 30.

The first semiconductor layer 10 has a first surface 10a opposed to the light emitting layer 30, and a second surface 10b on the opposite side from the first surface 10a. In this example, the second surface 10b constitutes a light extraction surface. The second surface 10b is provided with unevenness 11. This suppresses total reflection at the second surface 10b of the light emitted from the light emitting layer 30, and can increase the light extraction efficiency.

The optical path control section 40 is provided in the stacked body SB. The optical path control section 40 extends along the Z-axis direction, and penetrates through the second semiconductor layer 20 and the light emitting layer 30. The optical path control section 40 changes the traveling direction of the light emitted from the light emitting layer 30. The optical path control section 40 has an insulating property against e.g. the voltage applied between the first semiconductor layer 10 and the second semiconductor layer 20. The refractive index of the optical path control section 40 is lower than the refractive index of the first semiconductor layer 10, the refractive index of the second semiconductor layer 20, and the refractive index of the light emitting layer 30. The optical path control section 40 is made of e.g. a low refractive index material such as optical glass and optical plastic. The material of the optical path control section 40 may be air. That is, the optical path control section 40 may be a gap.

The second semiconductor layer 20 has a first region 20r surrounding the optical path control section 40 as projected on a plane (X-Y plane) perpendicular to the Z-axis direction. The light emitting layer 30 has a second region 30r surrounding the optical path control section 40 as projected on the X-Y plane. Each of the first region 20r and the second region 30r is one continuous region. That is, the second semiconductor layer 20 and the light emitting layer 30 are not divided by the optical path control section 40. Here, the second semiconductor layer and the light emitting layer 30 may have a region surrounded with the optical path control section 40. In this case, the area projected on the X-Y plane of the region of the light emitting layer 30 surrounded with the optical path control section 40 is preferably e.g. 10% or less of the area of the outer shape 30g of the light emitting layer 30 projected on the X-Y plane.

The optical path control section 40 projected on the X-Y plane is shaped like e.g. a line. In this example, the optical path control section 40 projected on the X-Y plane is shaped like a straight line. Alternatively, the optical path control section 40 projected on the X-Y plane may be shaped like e.g. a curve, or a kinked line.

In this example, the optical path control section 40 is provided in a plurality in the stacked body SB. Each of the plurality of optical path control sections 40 penetrates through the second semiconductor layer 20 and the light emitting layer 30. The first region 20r surrounds each of the plurality of optical path control sections 40 as projected on the X-Y plane. The second region 30r surrounds each of the plurality of optical path control sections 40 as projected on the X-Y plane. Thus, each of the plurality of optical path control sections 40 is surrounded with one continuous region of the second semiconductor layer 20 and surrounded with one continuous region of the light emitting layer 30.

In this example, one of the plurality of optical path control sections 40 is a first optical path control section 41 shaped like a line extending in the X-axis direction. Another one of the plurality of optical path control sections 40 is a second optical path control section 42 shaped like a line extending in the Y-axis direction. In this example, a plurality of first optical path control sections 41 and a plurality of second optical path control sections 42 are provided. The plurality of first optical path control sections 41 and the plurality of second optical path control sections 42 are arranged like e.g. a mesh.

The area of the optical path control section 40 projected on the X-Y plane is 0.5% or more and 10% or less of the area of the outer shape 30g of the light emitting layer 30 projected on the X-Y plane. In this example, the total area of the plurality of optical path control sections 40 projected on the X-Y plane is 0.5% or more and 10% or less of the area of the outer shape 30g of the light emitting layer 30 projected on the X-Y plane.

As projected on the X-Y plane, the distance Ds1 between two adjacent optical path control sections 40 is e.g. 1 times or more and 20 times or less of the thickness of the stacked body SB. As projected on the X-Y plane, the distance Ds2 between the end portion 30t of the light emitting layer 30 and one of the plurality of optical path control sections 40 adjacent to the end portion 30t is e.g. 1 times or more and 20 times or less of the thickness of the stacked body SB.

As projected on the X-Y plane, the length Ls1 in the extending direction of the linear optical path control section 40 is 5 times or more of the length Ls2 in the width direction of the linear optical path control section 40. For instance, the extending direction of the first optical path control section 41 is the X-axis direction. The width direction of the first optical path control section 41 is the Y-axis direction. The extending direction of the second optical path control section 42 is the Y-axis direction. The width direction of the second optical path control section 42 is the X-axis direction. Thus, the extending direction of the optical path control section 40 refers to the direction in which the linear optical path control section 40 extends. The width direction of the optical path control section 40 refers to the direction perpendicular (normal) to the extending direction. In the case where the optical path control section 40 is shaped like a curve or a kinked line, for instance, the extending direction changes along the optical path control section 40.

The width Ws of the optical path control section 40 in the direction perpendicular to the Z-axis direction continuously decreases in the direction from the second semiconductor layer 20 toward the first semiconductor layer 10. That is, the cross section parallel to the Z-axis direction (e.g., Z-X cross section or Z-Y cross section) of the optical path control section 40 is shaped like a wedge or a trapezoid. Thus, for instance, the light traveling generally parallel to the film surface of the light emitting layer 30 can be totally reflected by the optical path control section 40 and directed to the second surface 10b constituting a light extraction surface. The width Ws is a width in the direction perpendicular to the Z-axis direction and perpendicular to the extending direction of the linear optical path control section 40. For instance, in the first optical path control section 41, the width Ws is the width in the Y-axis direction. In the second optical path control section 42, the width Ws is the width in the X-axis direction.

The optical path control section 40 has a side surface 40s non-parallel to the Z-axis direction. The angle θs between the side surface 40s and the X-Y plane is e.g. 30° or more and 60° or less.

The maximum of the width Ws of the optical path control section 40 is e.g. larger than or equal to the wavelength of the light emitted from the light emitting layer 30. The maximum of the width Ws of the optical path control section 40 is e.g. twice or less of the thickness of the second semiconductor layer 20. In this example, the maximum of the width Ws of the optical path control section 40 is substantially equal to the length Ls2 in the width direction of the optical path control section 40 as projected on the X-Y plane.

The distance along the Z-axis direction between the second surface 10b and the optical path control section 40 is denoted by Dt1. The distance along the Z-axis direction between the second surface 10b and the light emitting layer 30 is denoted by Dt2. The absolute value of the difference df between the distance Dt1 and the distance Dt2 is longer than half the wavelength of the light emitted from the light emitting layer 30. Specifically, the distance Dt1 is the distance along the Z-axis direction between the second surface 10b and the end portion 40p of the optical path control section 40. The difference df is, in other words, the amount of protrusion from the light emitting layer 30 of the optical path control section 40 penetrating through the light emitting layer 30. In the case where the second surface 10b is provided with unevenness 11, the position in the Z-axis direction of the second surface 10b is e.g. the position of the average height of the unevenness 11.

The length Dt3 along the Z-axis direction of the optical path control section 40 is three times or more of the wavelength of the light emitted from the light emitting layer 30 and half or less of the thickness of the stacked body SB.

In this example, the semiconductor light emitting device 110 further includes a support substrate 5, a first electrode 71, and a second electrode 72.

The support substrate 5 is e.g. at least one of a sapphire substrate, SiC substrate, GaN substrate, and Si substrate. The second semiconductor layer 20 is provided between the support substrate 5 and the light emitting layer 30.

The first electrode 71 is electrically connected to the first semiconductor layer 10. The first semiconductor layer 10 is provided between the light emitting layer 30 and the first electrode 71. The first electrode 71 is shaped like e.g. a frame, and exposes part of the second surface 10b constituting a light extraction surface. The first electrode 71 is made of e.g. a stacked body of Ti film/Pt film/Au film.

The second electrode 72 is electrically connected to the second semiconductor layer 20. The second electrode 72 is provided between the support substrate 5 and the light emitting layer 30. The second semiconductor layer 20 is provided between the light emitting layer 30 and the second electrode 72. In this example, the support substrate 5, the second electrode 72, the second semiconductor layer 20, the light emitting layer 30, the first semiconductor layer 10, and the first electrode 71 are stacked in this order. The second electrode 72 is made of e.g. silver.

The reflectance of the second electrode 72 is higher than the reflectance of the second semiconductor layer 20. In this example, the second electrode 72 is opposed to the entire surface of the second semiconductor layer 20 and the entire surface of the light emitting layer 30. The second electrode 72 reflects the light traveling from the light emitting layer 30 toward the second semiconductor layer 20, and directs the light to the second surface 10b. This can increase the light extraction efficiency of the semiconductor light emitting device 110. That is, the second electrode 72 functions as a light reflecting layer RL. Alternatively, a light reflecting layer RL may be provided independently of the second electrode 72.

In the design of a semiconductor light emitting device, the light extraction efficiency is one of the important factors. In what is called a light emitting diode (LED), spontaneous emission light emitted in indeterminate directions must be efficiently extracted. Thus, it can be said that the design of LED having high light extraction efficiency is more difficult than that of a semiconductor laser. In recent years, solid state lighting technology based on semiconductor light emitting devices has been expected as one of the novel lighting technologies, and there is demand for increasing the light emission efficiency. Conventionally, the face-up structure has been used as the basic structure of the light emitting device. However, currently, the structure called the flip-chip structure has been going mainstream. Furthermore, in order to increase the utilization efficiency of the light emitting layer and to realize higher light extraction efficiency, substitution of the structure called the thin-film structure is in progress.

In the aforementioned flip-chip structure and thin-film structure, on one of the semiconductor layers (typically, on the p-type layer side), a reflecting metal layer as a light reflecting layer is formed. Thus, the light emitted from the surface on the opposite side can be extracted. Furthermore, it is conventionally known that the light extraction surface provided with some kind of uneven structure is typically more advantageous to light extraction than being smooth.

Also in the conventional flip-chip structure and thin-film structure, a light extraction efficiency higher than that of the face-up structure can be expected. However, the reflecting metal layer absorbs a considerable amount of light. Furthermore, the sealant has a considerably smaller refractive index than semiconductor. Moreover, in the flip-chip structure, reflection at the crystal growth substrate interface, for instance, is a detrimental factor to the increase of light extraction efficiency. Thus, in the conventional configuration, it cannot be said that a sufficient light extraction efficiency is obtained.

There have been proposals for improvement of this situation, such as radiation control of light emission by the introduction of a photonic crystal, and efficiency enhancement based on the increase of the chip end reflecting surface by forming an artificial LED array. These methods can be expected to significantly increase the light extraction efficiency in view of the efficiency alone. However, in structure, the light emitting layer needs to be remarkably removed. Thus, the area of the light emitting layer per total area of the chip is significantly decreased. This means that to obtain an equal amount of light by an equal area, the current density during operation is significantly increased. This is one of the causes of the significant decrease of internal quantum efficiency by the droop phenomenon. Thus, this is not an appropriate solution for applications requiring considerations also on cost effectiveness and productivity, such as lighting applications.

Furthermore, as described above, the LED is based on spontaneous light emission. Thus, photons generated in the light emitting layer are emitted in arbitrary directions every time. This reveals one of the drawbacks of the flip-chip structure and the thin-film structure. The main light extraction direction is typically a surface direction parallel to the light emitting layer. However, some of the generated photons have wave vectors nearly parallel to the light emitting layer. This component accounts for a non-negligible amount. For instance, in the case of isotropic radiation, approximately 10% of the total light emission energy is contained in the range of ±5.7° (gradient 1/10) with respect to the active layer surface. In the range of gradient 1/20, 5% is contained. These components have substantially no chance of being emitted outside until reaching the device side surface. Thus, these components are likely to be absorbed again in the light emitting layer and turned to heat.

Actually, the refractive index of the light emitting layer is typically higher than the refractive index of the semiconductor layer therearound. Thus, the light emitting layer exhibits the appearance of a slab waveguide. That is, part of the light generated in the light emitting layer is coupled with the slab mode. The uncoupled components are also made close to propagation in the direction of the light emitting layer plane (lose the wavenumber components in the direction perpendicular to the light emitting layer surface). In addition, absorption in the light emitting layer is higher than absorption in the portion corresponding to the cladding. As a result, actually, more light energy than that under the aforementioned premise is lost. Thus, the method for rapidly releasing this optical component coupled with the slab mode is also important.

In the semiconductor light emitting device 110 according to this embodiment, the optical path control section 40 composed of a low refractive index material or a gap is placed so as to penetrate through the light emitting layer 30. Thus, the light having a wavenumber component parallel or nearly parallel to the film surface of the light emitting layer 30 can be efficiently scattered. This can facilitate extracting light components having wave vectors nearly parallel to the film surface of the light emitting layer 30, which have been difficult to extract in the conventional structure. Thus, the light extraction efficiency of the semiconductor light emitting device 110 can be increased.

Furthermore, in the semiconductor light emitting device 110 according to this embodiment, the light emitting layer 30 has a continuous second region 30r so that the light emitting layer 30 is not divided by the optical path control section 40. This can suppress the decrease of the light emission area.

The light extraction efficiency can be further increased by providing unevenness 11 on the second surface 10b. Furthermore, the optical path control section 40 and the unevenness 11 are related in a complementary manner. Thus, a synergistic effect can be expected.

Furthermore, the semiconductor light emitting device 110 can also suppress e.g. the power consumption with the increase of the light extraction efficiency. Moreover, for instance, heat generation due to reabsorption of light is suppressed. This can offer prospects for such effects as suppressing the decrease of internal quantum efficiency in the light emitting layer 30, reducing the power consumption of peripheral circuits after implementation, and simplifying the heat dissipation mechanism.

Figure 2:
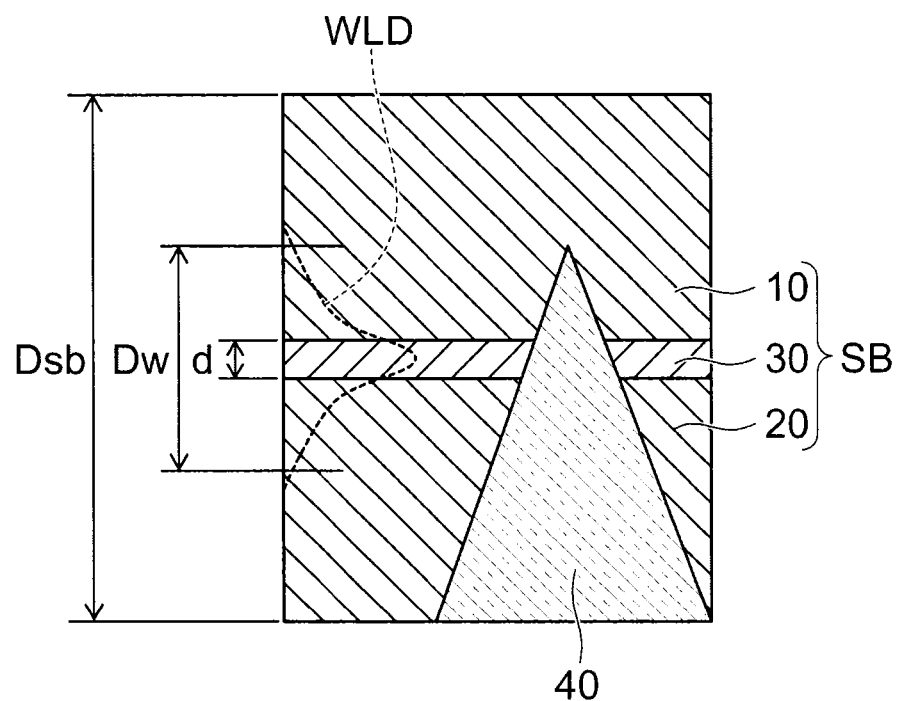
FIG. 2 is a schematic sectional view showing part of the semiconductor light emitting device according to the embodiment.

FIG. 2 is a schematic sectional view showing part of the semiconductor light emitting device according to the embodiment. FIG. 2 illustrates the light intensity distribution WLD of the guided mode.

In the slab mode, the spread in the Z-axis direction (thickness direction) of the maximally confined guided mode is $\lambda_s/2$ ($\lambda_s$ is the wavelength in the material of the light emitted from the light emitting layer 30). However, this is the case where the refractive index difference is infinite and the slab thickness is $\lambda_s/2$. The actual refractive index difference is approximately several %. Thus, the light energy significantly penetrates out around the light emitting layer 30 as evanescent waves. Furthermore, the spread in the Z-axis direction of the guided mode depends also on e.g. the refractive index difference between the light emitting layer 30 and the surroundings, and the thickness (length along the Z-axis direction) of the light emitting layer 30.

Typically, the penetration distance of light energy is approximately $\lambda/4$ or more and $\lambda/2$ or less from the interface of the light emitting layer 30. Thus, the spatially spreading distance Dw of the guided mode is e.g. approximately $d+\lambda/2$ or more and $d+\lambda$ or less in the Z-axis direction centered around the light emitting layer 30. Here, d is the thickness of the light emitting layer 30. That is, it is effective to provide an optical path control section 40 having the aforementioned width in the Z-axis direction so as to traverse (penetrate) the light emitting layer 30.

As described above, the light energy contained in the gradient 1/10 accounts for 10% of the total. With reference to a gradient 1/10, during the vertical round trip in the stacked body SB, this optical component laterally propagates a distance of approximately 20 Dsb (Dsb is the thickness of the stacked body SB). Thus, for instance, in the case where a plurality of optical path control sections 40 are provided, the distance between two adjacent optical path control sections 40 is set to 20 Dsb or less to achieve effective scattering by the optical path control sections 40. Here, it is considered that optical components having wave vectors with larger gradients reach the light extraction surface (second surface 10b) at a relatively early stage and are extracted outside, or efficiently scattered at the light extraction surface. Thus, the influence of the optical path control section 40 on these components is not considered in this embodiment.

As described above, preferably, the optical path control sections 40 are arranged with a spacing of 20 Dsb or less. The effect thereof becomes higher as the spacing becomes narrower. However, in the portion provided with the optical path control sections 40, the light emitting layer 30 is removed. Thus, the footprint itself of the optical path control section 40 is preferably smaller. Accordingly, it is preferable that the optical path control section 40 be macroscopically shaped like a line. More specifically, the length Ls1 in the extending direction (longitudinal direction) is preferably 5 times or more of the length Ls2 in the width direction. If the length in the extending direction is shorter than this, the scattering efficiency per footprint is decreased.

The length Ls2 in the width direction of the optical path control section 40 is preferably narrower. However, it has a lower limit depending on the cross-sectional shape and height of the optical path control section 40. In the case of the smallest optical path control section 40 according to this embodiment, the height is d+λ/2+α≈λ, and the angle of the oblique side is 60° (described later). Thus, the length Ls2 in the width direction of the optical path control section 40 is approximately 1.15λ. With some fluctuations taken into consideration, the lower limit is approximately λ. Here, α is the thickness of the second semiconductor layer 20.

On the other hand, there is no upper limit from the viewpoint of achieving the functionality. However, if the length Ls2 in the width direction is increased, remove to the light emitting layer 30 is increased. The lower limit of the angle θs of the side surface 40s is e.g. 30° (described later). Suppose an optical path control section 40 having a height equal to the thickness Dsb of the stacked body SB. Then, the length Ls2 in the width direction of the optical path control section 40 is 2 Dsb. Preferably, the length Ls2 is thinner than this. With reference to the practical upper limit of the size, the angle θs of the side surface 40s is e.g. 45°. The length Dt3 (height) along the Z-axis direction of the optical path control section 40 is e.g. Dsb/2. Thus, more preferably, the length Ls2 in the width direction of the optical path control section 40 is Dsb or less.

Based on the foregoing, a minimal arrangement of the optical path control section 40 according to this embodiment is performed. For instance, suppose that the length Ls2 in the width direction of the optical path control section 40 is 0.2 Dsb, and the distance Ds1 between two adjacent optical path control sections 40 is 20 Dsb. Then, a plurality of optical path control sections 40 are arranged like a mesh. In this case, the remove ratio of the light emitting layer 30 is 2%. The remove ratio is a ratio of an amount of removed part of the light emitting layer 30 to an amount of the light emitting layer 30 before the removing. Even in the case where the length Ls2 is set to Dsb, the remove ratio is 9.8%. Thus, 90% or more of the area of the light emitting layer 30 is still effective.

Figure 3A:
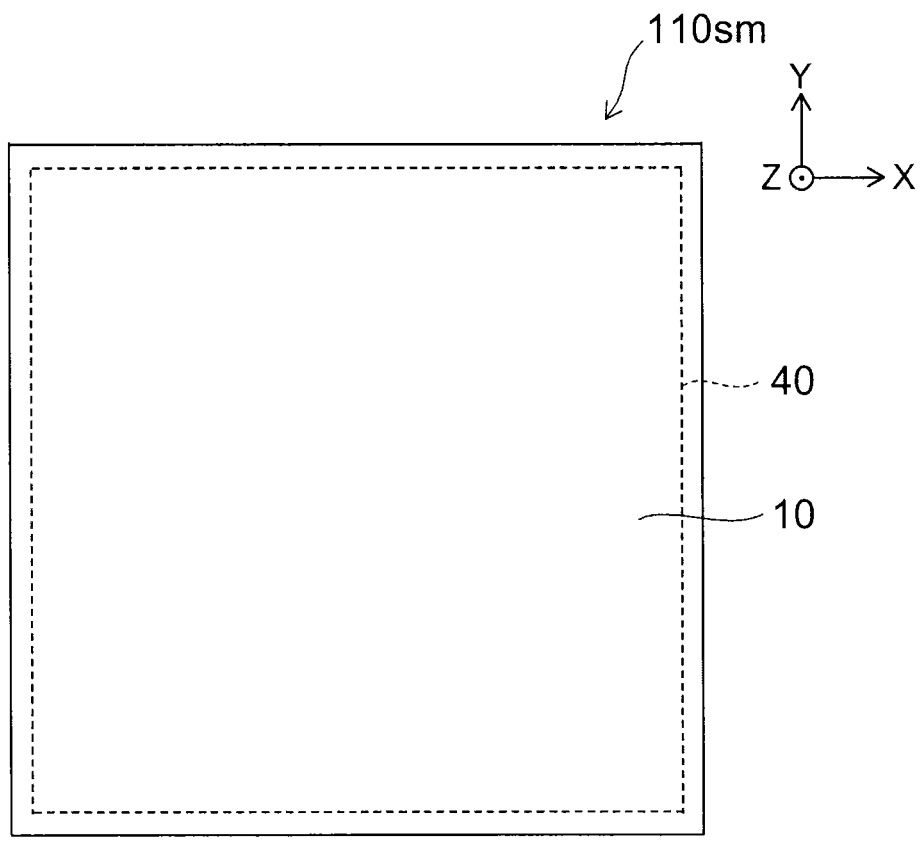
FIGS. 3A and 3B are schematic sectional views showing a simulation model of the semiconductor light emitting device according to the embodiment.
Figure 3B:
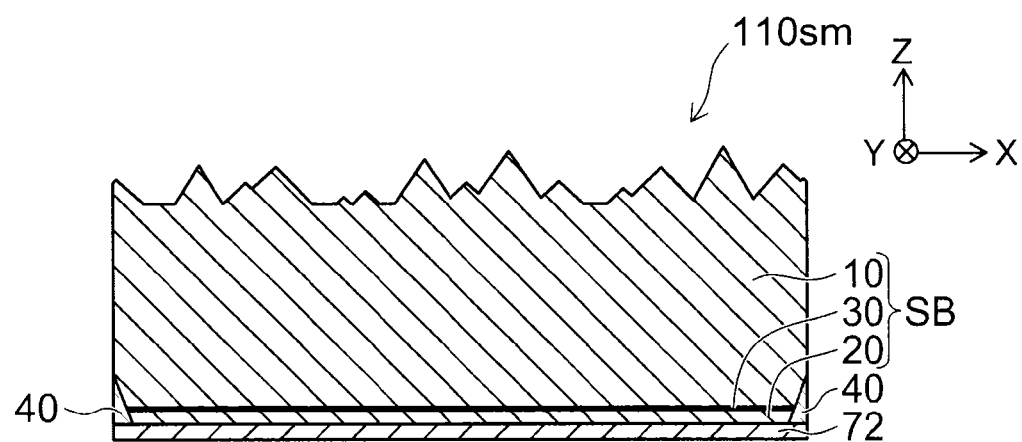

FIGS. 3A and 3B are schematic sectional views showing a simulation model of the semiconductor light emitting device according to the embodiment.

Figure 4:
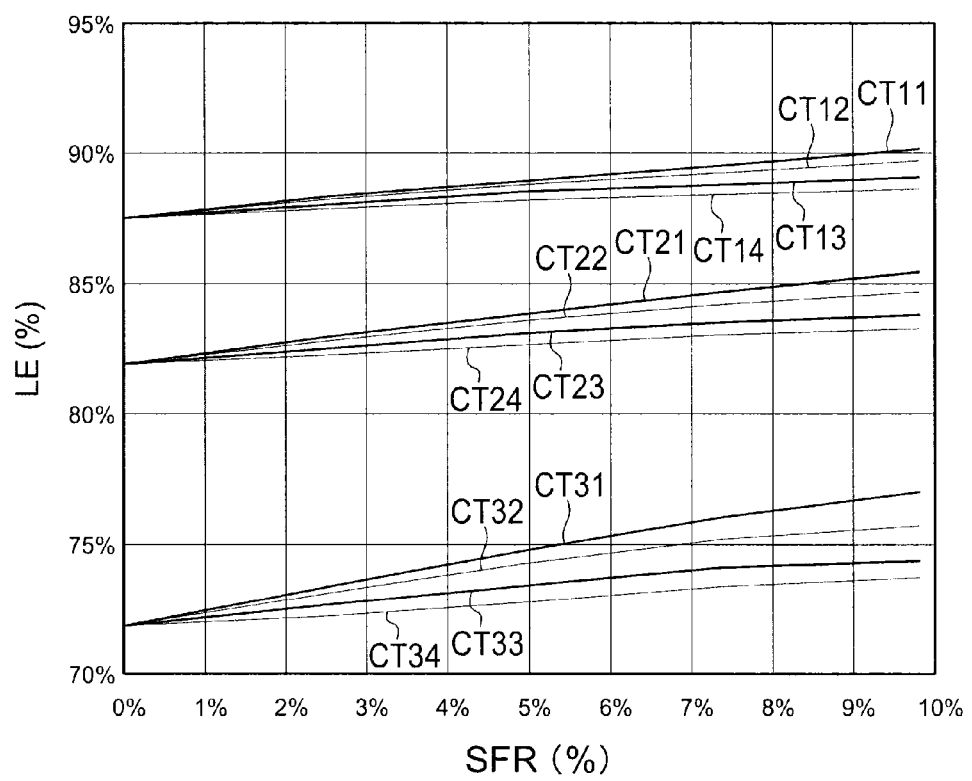
FIG. 4 is a graph illustrating a result of the simulation of the semiconductor light emitting device according to the embodiment.

FIG. 4 is a graph illustrating the result of the simulation of the semiconductor light emitting device according to the embodiment.

In FIG. 4, the horizontal axis represents the filling ratio SFR (%) of the optical path control section 40. The vertical axis represents the light extraction efficiency LE (%).

As shown in FIGS. 3A and 3B, in the semiconductor light emitting device 110sm of the simulation model, an optical path control section 40 shaped like a frame is used.

In the simulation, for the structure of the semiconductor light emitting device 110sm, the area filling ratio SFR and the light extraction efficiency LE of the optical path control section 40 are calculated, and the correlation therebetween is determined.

In FIG. 4, characteristics CT11-CT14 are simulation results under the condition of only the light emission from electric dipoles oscillating in the direction parallel to the film surface of the light emitting layer 30 (TE-like emission). Characteristics CT31-CT34 are simulation results under the condition of only the light emission from electric dipoles oscillating in the direction perpendicular to the film surface of the light emitting layer 30 (TM-like emission). Characteristics CT21-CT24 are simulation results under the isotropic condition (isotropic emission), i.e., the sum of TE-like emission and TM-like emission. In the characteristic CT11, characteristic CT21, and characteristic CT31, the refractive index of the optical path control section 40 is set to 1.00 (e.g., air). In the characteristic CT12, characteristic CT22, and characteristic CT32, the refractive index of the optical path control section 40 is set to 1.39 (e.g., some SOG, $MgF_2$, or LiF). In the characteristic CT13, characteristic CT23, and characteristic CT33, the refractive index of the optical path control section 40 is set to 1.47 (e.g., $SiO_2$). In the characteristic CT14, characteristic CT24, and characteristic CT34, the refractive index of the optical path control section 40 is set to 2.11 (e.g., AlN).

In the simulation, calculation is performed assuming several values for the refractive index of the optical path control section 40 in the range of 1.00 or more and 2.11 or less. However, the trends are all the same. Approximately when the filling ratio SFR exceeds 7%, the increase of the light extraction efficiency LE begins to become gradual. From this result, it is conjectured that even if the filling ratio SFR is made higher than 10%, the effect is small.

Previously, it was stated that it is effective to provide an optical path control section 40 so as to traverse the light emitting layer 30. To demonstrate this, simulation-based calculation was performed.

In the simulation, in the semiconductor light emitting device 110sm of the simulation model shown in FIGS. 3A and 3B, the thickness of the second semiconductor layer 20 is set to 370 nm, and the thickness of the light emitting layer 30 is set to 60 nm. For the first semiconductor layer 10, an n-type GaN layer is used. For the second semiconductor layer 20, a p-type GaN layer is used. For the optical path control section 40, a glass ($SiO_2$) with refractive index $n_{scat}$=1.47 is used. For the second electrode 72 (light reflecting layer RL), silver is used. The angle θs of the optical path control section 40 is 53.7°. This model is close to the structure of e.g. a near-ultraviolet LED.

Figure 5A:
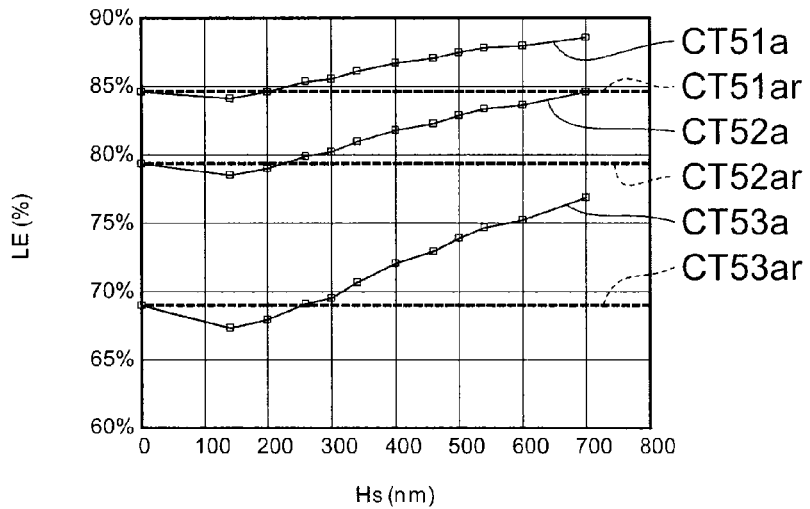
FIGS. 5A to 5C are graphs illustrating the result of the simulation of the semiconductor light emitting device according to the embodiment.
Figure 5B:
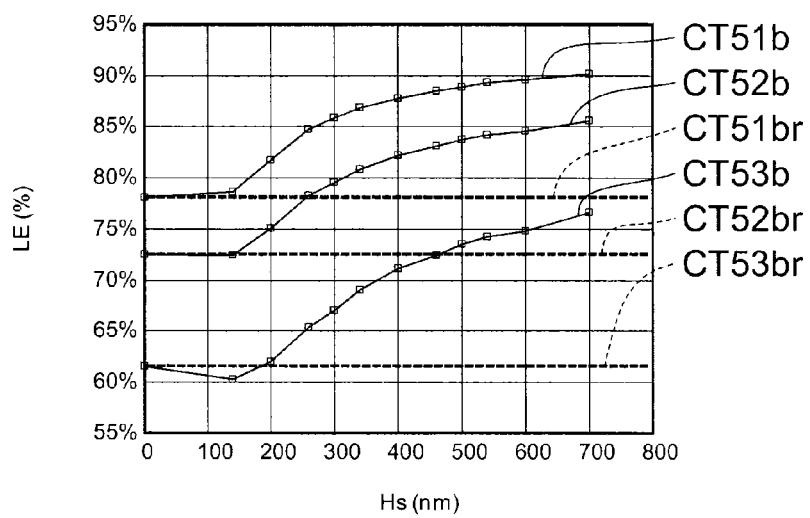
Figure 5C:
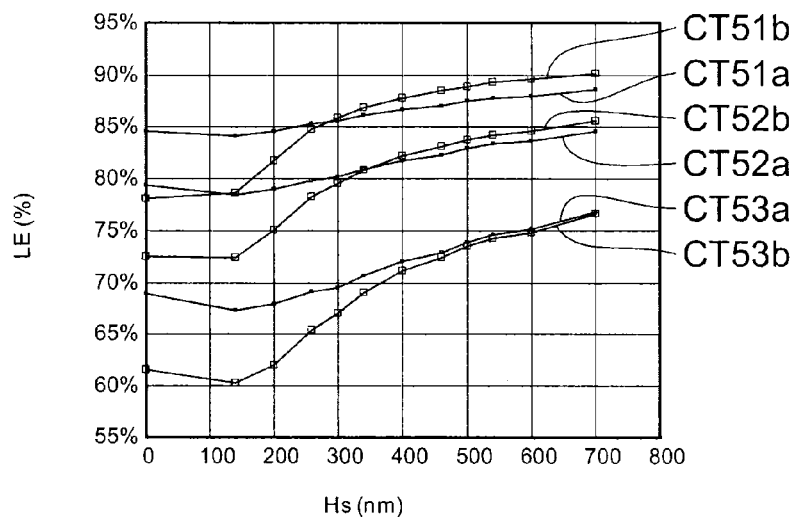

FIGS. 5A to 5C are graphs illustrating the result of the simulation of the semiconductor light emitting device according to the embodiment.

The horizontal axis of FIGS. 5A to 5C represents the height (length in the Z-axis direction) Hs (nm) of the optical path control section 40. The vertical axis of FIGS. 5A to 5C represents the light extraction efficiency LE (%).

FIG. 5A shows a simulation result in the case assuming that the refractive index ($n_{act}$) of the light emitting layer 30 is $n_{act}=n_{GaN}$. Here, $n_{GaN}$ is the refractive index of GaN.

FIG. 5B shows a simulation result in the case assuming $n_{act}>n_{GaN}$. Specifically, this is a simulation result in the case assuming an MQW (8QW) structure of GaN/InGaN.

FIG. 5C shows a superposition of the result of FIG. 5A and the result of FIG. 5B for comparison.

In FIGS. 5A to 5C, characteristic CT51a and characteristic CT51b are simulation results under the condition of TE-like emission. Characteristic CT53a and characteristic CT53b are simulation results under the condition of TM-like emission. Characteristic CT52a and characteristic CT52b are simulation results under the condition of isotropic emission.

Furthermore, in FIGS. 5A and 5B, characteristic CT51ar is a simulation result under the same condition as the characteristic CT51a in the configuration of a reference example provided with no optical path control section 40. Similarly, characteristic CT51br, characteristic CT52ar, characteristic CT52br, characteristic CT53ar, and characteristic CT53br are simulation results under the same condition as the characteristic CT51b, characteristic CT52a, characteristic CT52b, characteristic CT53a, and characteristic CT53b, respectively, in the configuration of the reference example.

In the case of $n_{act}=n_{GaN}$, if the optical path control section 40 is very small, it is shown that the light extraction efficiency LE rather decreases. The reason for this is considered as follows. If the optical path control section 40 is too small, total reflection does not occur. Thus, the optical path control section 40 acts as a reflection suppressor for the light reflecting layer RL depending on the condition. Achieving the effect of total reflection requires at least a size in which the reflection can be defined by plane wave expansion. Thus, the slope length needs to be e.g. λ or more. The effect begins to appear when the height Hs of the optical path control section 40 is approximately 200-300 nm. At approximately a size reaching the light emitting layer 30, the increase ratio of the light extraction efficiency LE to the change of the size is maximized. That is, in this example, the increase ratio of the light extraction efficiency LE is maximized at approximately Hs=370 nm.

When the optical path control section 40 is further increased, the degree of increase of the light extraction efficiency LE begins to decrease. Beyond approximately 500-540 nm, this trend is made remarkable. The light emitting layer penetration depth of the optical path control section 40 in this case is 70-110 nm, corresponding to 0.4λ-0.6λ. This is also in agreement with the previous consideration.

As shown in FIG. 5B, in the case of $n_{act}>n_{GaN}$ ($n_{act}=2.496$), the efficiency decrease is similarly shown in the case where the optical path control section 40 is very small. However, the influence is smaller than in the case of $n_{act}=n_{GaN}$. It is considered that this is because the existence of the slab guided mode acts positively and reduces optical components affected by the optical path control section 40. As if suggesting this, the light extraction efficiency LE begins to sharply increase at 260 nm (0.6λ before the light emitting layer 30) at which the tip of the optical path control section 40 begins to interfere with the slab mode. At a larger size, the increase ratio of the light extraction efficiency LE gradually decreases. At 540 nm (penetrating 0.6λ through the light emitting layer 30), it can be said that the light extraction efficiency LE is almost saturated. The total change in this case is more remarkable than in the case of $n_{act}=n_{GaN}$. Thus, it is shown that it is more effective in the existence of a slab guided mode.

As shown in FIG. 5C, the light extraction efficiency is decreased 6-9% by the slab guided mode. However, it is shown that the light extraction efficiency can be increased 12-14% by the introduction of the optical path control section 40.

Figure 6:
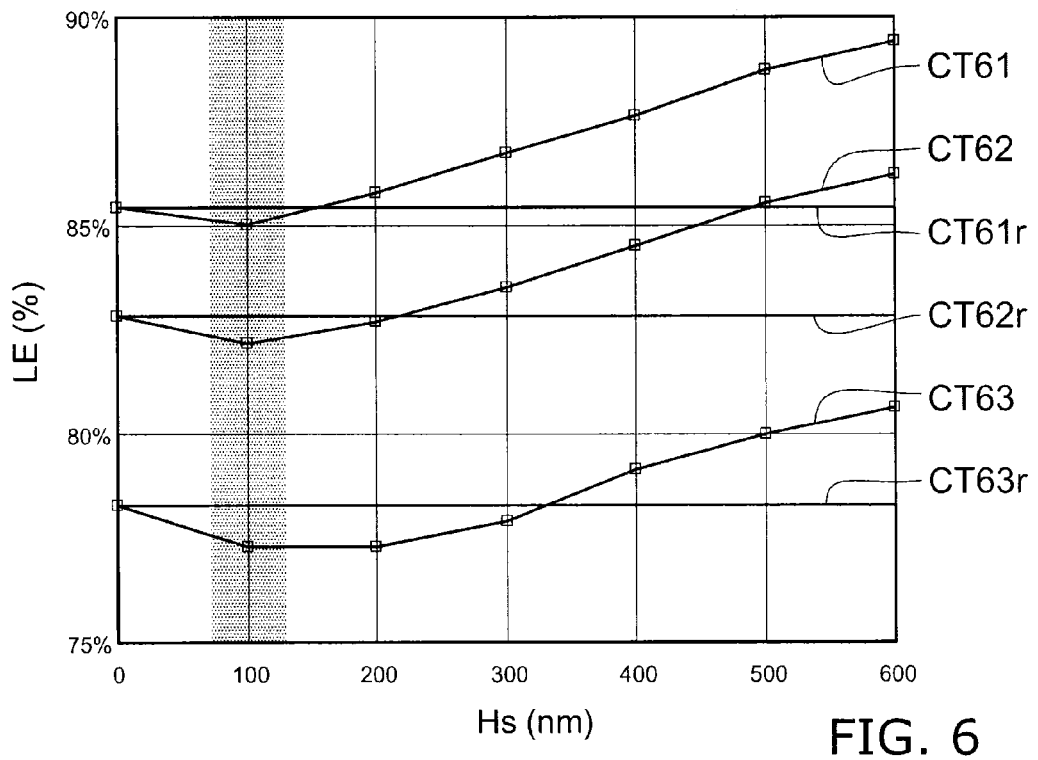
FIG. 6 is a graph illustrating the result of the simulation of the semiconductor light emitting device according to the embodiment.

FIG. 6 is a graph illustrating the result of the simulation of the semiconductor light emitting device according to the embodiment.

The horizontal axis of FIG. 6 represents the height (length in the Z-axis direction) Hs (nm) of the optical path control section 40. The vertical axis of FIG. 6 represents the light extraction efficiency LE (%).

FIG. 6 shows a simulation result in the case where the thickness of the second semiconductor layer 20 is set to 70 nm and $n_{act}>n_{GaN}$. This model is close to the structure of a typical blue LED.

In FIG. 6, characteristic CT61 is a simulation result under the condition of TE-like emission. Characteristic CT63 is a simulation result under the condition of TM-like emission. Characteristic CT62 is a simulation result under the condition of isotropic emission.

Furthermore, in FIG. 6, characteristic CT61r is a simulation result under the same condition as the characteristic CT61 in the configuration of the reference example provided with no optical path control section 40. Similarly, characteristic CT62r and characteristic CT63r are simulation results under the same condition as the characteristic CT62 and characteristic CT63, respectively, in the configuration of the reference example.

In the case of this structure, the optical path control section 40 itself is too small even if penetrating through the light emitting layer 30. Furthermore, in the region where the second semiconductor layer 20 is sufficiently thin (<λ/2), the change of the radiation pattern due to self-interference of mirror image dipole emission is significant. Thus, at the stage of photon emission, the emission of components parallel to the film surface of the light emitting layer 30 is suppressed. Under this condition, the optical path control section 40 functions effectively only in the case of a sufficient size (e.g., the height Hs is 500 nm or more). In such a case, preferably, the height Hs of the optical path control section 40 is 3λ or more.

Figure 7:
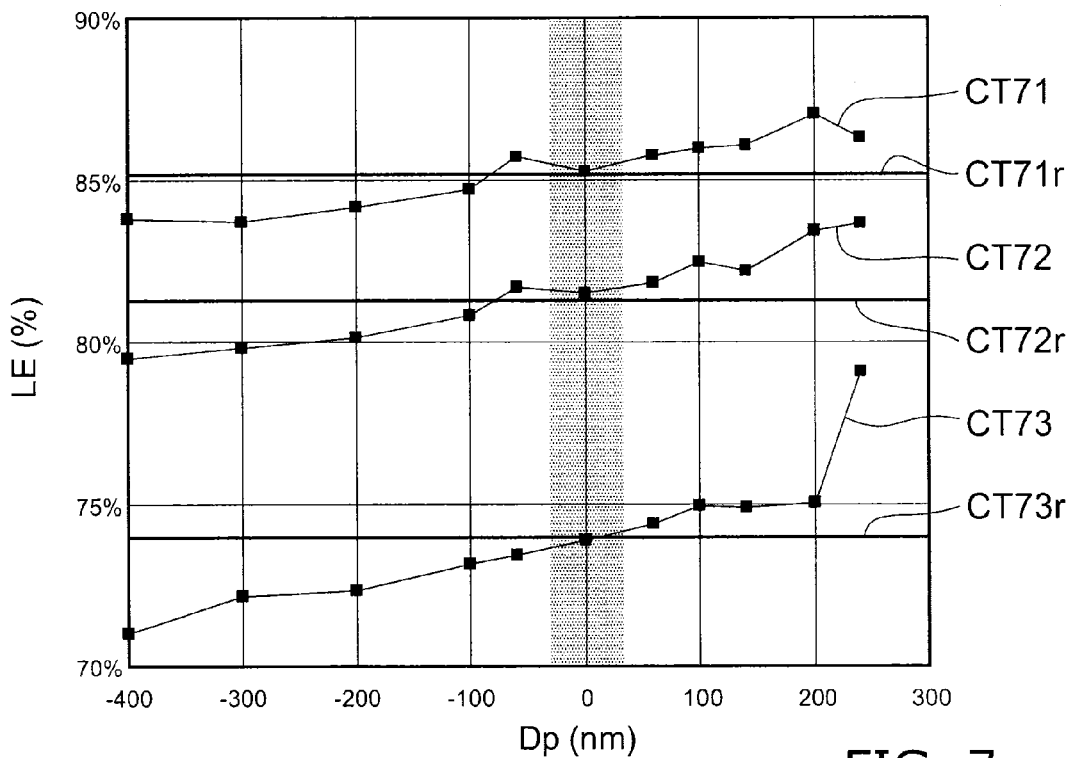
FIG. 7 is a graph illustrating the result of the simulation of the semiconductor light emitting device according to the embodiment.

FIG. 7 is a graph illustrating the result of the simulation of the semiconductor light emitting device according to the embodiment.

In FIG. 7, the horizontal axis represents the penetration depth Dp (nm) of the optical path control section 40. The vertical axis represents the light extraction efficiency LE (%). The penetration depth Dp of the optical path control section 40 is substantially equal to the absolute value of the difference df between the distance Dt1 along the Z-axis direction between the second surface 10b and the optical path control section 40 and the distance Dt2 along the Z-axis direction between the second surface 10b and the light emitting layer 30.

In FIG. 7, characteristic CT71 is a simulation result under the condition of TE-like emission. Characteristic CT73 is a simulation result under the condition of TM-like emission. Characteristic CT72 is a simulation result under the condition of isotropic emission.

Furthermore, in FIG. 7, characteristic CT71r is a simulation result under the same condition as the characteristic CT71 in the configuration of the reference example provided with no optical path control section 40. Similarly, characteristic CT72r and characteristic CT73r are simulation results under the same condition as the characteristic CT72 and characteristic CT73, respectively, in the configuration of the reference example.

The aforementioned simulations include the influence of the height Hs of the optical path control section 40 on the light extraction efficiency LE. Thus, a simulation in the case of fixing the height Hs of the optical path control section 40 was also performed. Instead, in this simulation, the thickness of the second semiconductor layer 20 is taken as a variable.

FIG. 7 shows a simulation result in the case of fixing the height Hs of the optical path control section 40 and taking the thickness of the second semiconductor layer 20 as a variable. In this simulation, the height Hs of the optical path control section 40 is set to 340 nm. In FIG. 7, Dp=0 nm corresponds to the state in which the end portion 40p of the optical path control section 40 is located at the center of the thickness of the light emitting layer 30.

The reference line in FIG. 7 represents the light extraction efficiency LE in the case of no optical path control section 40. The light extraction efficiency LE in the configuration of the end portion 40p of the optical path control section 40 not reaching the light emitting layer 30 falls below the reference line. This suggests that the optical path control section 40 not meeting the requirements of the configuration according to this embodiment may act negatively. Furthermore, in the region of penetrating 100 nm or more, the light extraction efficiency LE is definitely increased. This shows, as described above, the importance of the configuration in which the optical path control section 40 penetrates through the light emitting layer 30.

The light scattering effect by the optical path control section 40 is more effective for scattering by reflection, e.g., scattering by total reflection, than for scattering by refraction. Thus, the refractive index of the optical path control section 40 ($n_{scat}$) is required to be lower than that of the stacked body SB (e.g., the refractive index is set to $n_{GaN}$), and is preferably as low as possible. Furthermore, obviously, it is most efficient that the reflected light is directly scattered toward the light extraction surface. Thus, the reflection by the optical path control section 40 is caused to occur in the opposite direction from the light reflecting layer RL. Accordingly, the cross section of the optical path control section 40 is shaped like e.g. a wedge with the width narrowed from the light reflecting layer RL side toward the first semiconductor layer 10 side. Alternatively, it is preferable to place an optical path control section 40 having a shape thinned with the distance from the light reflecting layer RL.

Furthermore, it is most effective to reflect the slab mode guided light so as to be perpendicular to the light extraction surface. Thus, the most favorable angle θs between the side surface 40s of the optical path control section 40 and the film surface of the light emitting layer 30 (X-Y plane) is approximately 45°. From the total reflection condition in this situation, for instance, in the case of $n_{GaN}$=2.47, it is preferable that $n_{scat} \leq 1.75$. However, this is only one of the guidelines, because the light actually incident on the side surface 40s has various traveling angles, and includes totally reflected components even if the refractive index is higher to some extent.

For instance, the effect for $n_{scat}$=1.0 (hollow) is set to 1. Then, the effect for $n_{scat}$=1.75 is approximately 60%. Even for $n_{scat}$=2.11 (corresponding to AlN), an effect of approximately 30% remains. AlN is favorably matched with GaN-based semiconductor, and hence is useful if the optical path control sections 40 can be arranged with high density. Thus, for instance, $n_{scat} \leq 1.8$ is preferable if the efficiency decrease down to 50% of the hollow situation is acceptable. Alternatively, $n_{scat} \leq 2.11$ is preferable if the decrease down to 30% is acceptable in view of the matching property of materials. Here, the effect sharply decreases for still higher refractive index. Thus, even for materials having higher matching property such as AlGaN, it is not preferable to make the optical path control section 40 from such materials.

Figure 8:
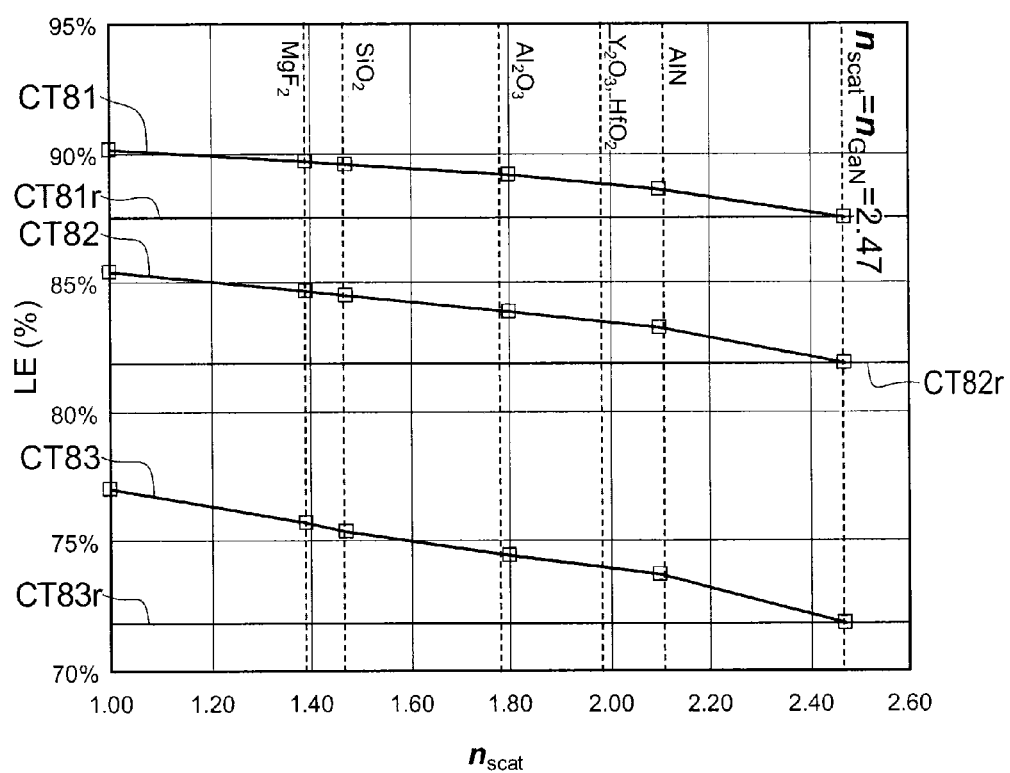
FIG. 8 is a graph illustrating the result of the simulation of the semiconductor light emitting device according to the embodiment.

FIG. 8 is a graph illustrating the result of the simulation of the semiconductor light emitting device according to the embodiment.

In FIG. 8, the horizontal axis represents the refractive index $n_{scat}$ of the optical path control section 40. The vertical axis represents the light extraction efficiency LE (%).

In FIG. 8, characteristic CT81 is a simulation result under the condition of TE-like emission. Characteristic CT83 is a simulation result under the condition of TM-like emission. Characteristic CT82 is a simulation result under the condition of isotropic emission.

Furthermore, in FIG. 8, characteristic CT81r is a simulation result under the same condition as the characteristic CT81 in the configuration of the reference example provided with no optical path control section 40. Similarly, characteristic CT82r and characteristic CT83r are simulation results under the same condition as the characteristic CT82 and characteristic CT83, respectively, in the configuration of the reference example.

FIG. 8 shows the correlation between the refractive index $n_{scat}$ of the optical path control section 40 and the light extraction efficiency LE in the case where the filling ratio SFR of the optical path control section 40 is set to 9.75%.

Figure 9A:
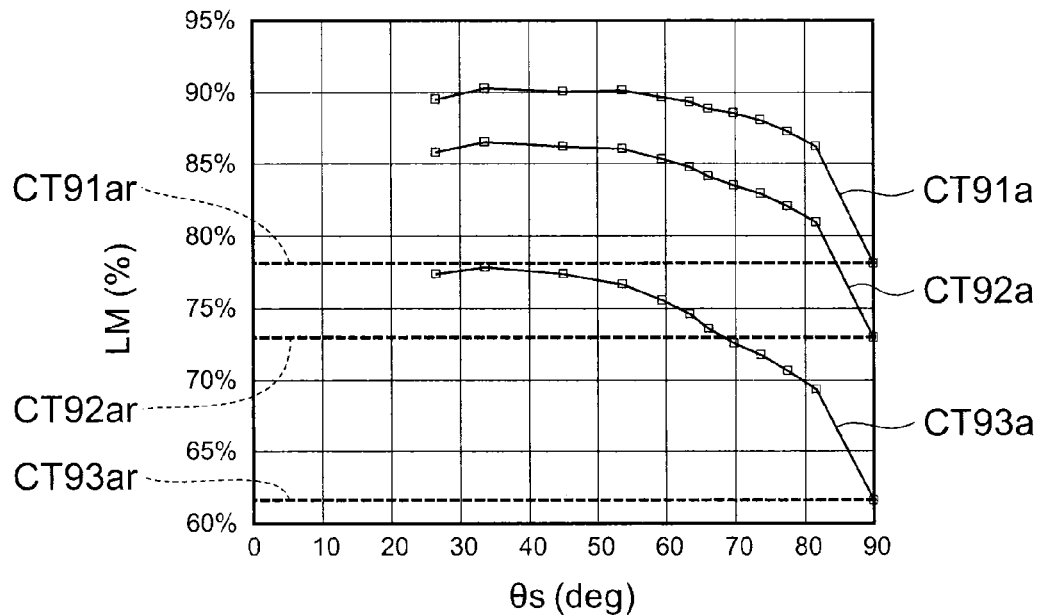
FIGS. 9A and 9B are graphs illustrating the result of the simulation of the semiconductor light emitting device according to the embodiment.
Figure 9B:
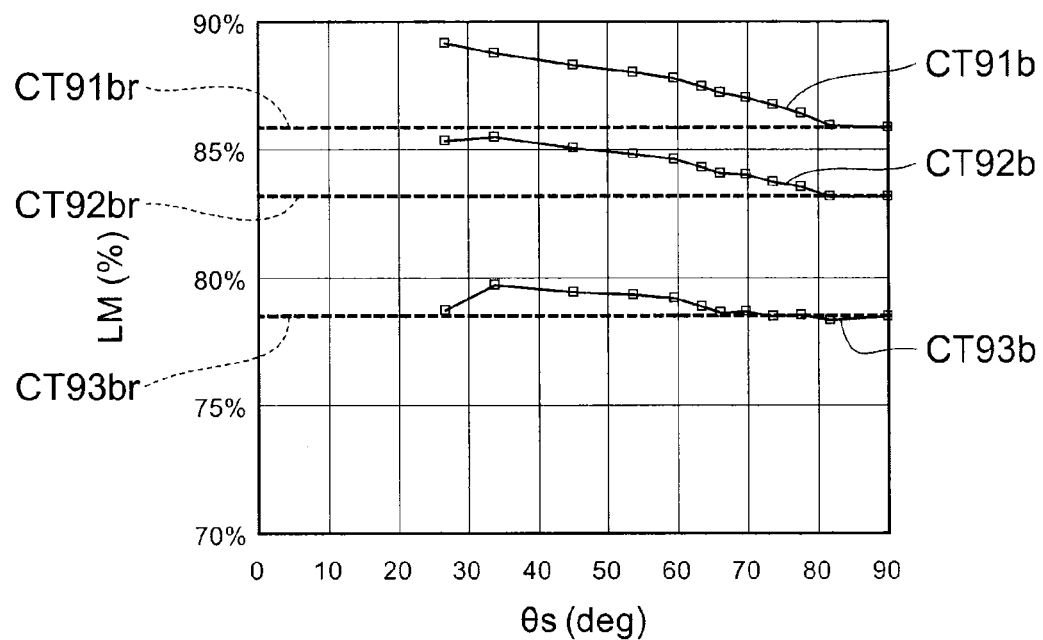

FIGS. 9A and 9B are graphs illustrating the result of the simulation of the semiconductor light emitting device according to the embodiment.

In FIGS. 9A and 9B, the horizontal axis represents the angle θs of the side surface 40s of the optical path control section 40. The vertical axis represents the light extraction efficiency LE (%).

FIGS. 9A and 9B show simulation results for the semiconductor light emitting device 110sm of the simulation model calculating the change of the light extraction efficiency LE when the angle θs is changed.

In FIGS. 9A and 9B, characteristic CT91a and characteristic CT91b are simulation results under the condition of TE-like emission. Characteristic CT93a and characteristic CT93b are simulation results under the condition of TM-like emission. Characteristic CT92a and characteristic CT92b are simulation results under the condition of isotropic emission.

Furthermore, in FIGS. 9A and 9B, characteristic CT91ar is a simulation result under the same condition as the characteristic CT91a in the configuration of the reference example provided with no optical path control section 40. Similarly, characteristic CT91br, characteristic CT92ar, characteristic CT92br, characteristic CT93ar, and characteristic CT93br are simulation results under the same condition as the characteristic CT91b, characteristic CT92a, characteristic CT92b, characteristic CT93a, and characteristic CT93b, respectively, in the configuration of the reference example.

In this simulation, the penetration depth Dp of the optical path control section 40 is 300 nm. The thickness of the light emitting layer 30 is 60 nm. Simulation was performed in two cases where the thickness of the second semiconductor layer 20 is set to 370 nm and 70 nm. FIG. 9A shows a simulation result in the case where the thickness of the second semiconductor layer 20 is set to 370 nm. FIG. 9B shows a simulation result in the case where the thickness of the second semiconductor layer 20 is set to 70 nm.

As described previously, in a simple estimation, the angle θs between the side surface 40s of the optical path control section 40 and the film surface of the light emitting layer 30 is ideally 45°. However, for the aforementioned reason, there is little difference even if the angle θs is changed to some extent. It is found that both cases exhibit favorable values in the range of θs=25-60°, and the efficiency sharply decreases outside this range. However, in the range of θs<30°, the width Ws of the optical path control section 40 sharply increases, and significantly decreases the effective area of the light emitting layer 30, which is undesirable. Thus, the range of 30° or more and 60° or less is preferable. Here, the most favorable value of θs is not 45° but approximately 35°. It is considered that this is because the chance of scattering is increased by the increase of the area of the side surface 40s.

Figure 10:
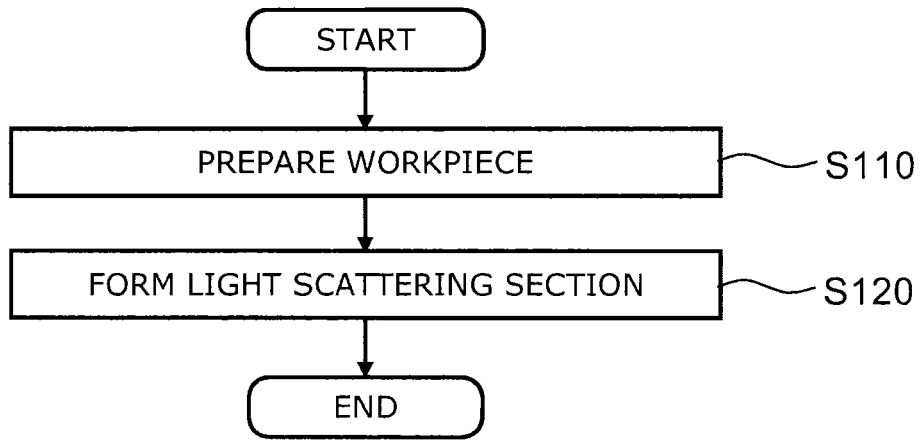
FIG. 10 is a flow chart illustrating a method for manufacturing a semiconductor light emitting device according to the embodiment.

FIG. 10 is a flow chart illustrating a method for manufacturing a semiconductor light emitting device according to the embodiment.

Figure 11A:
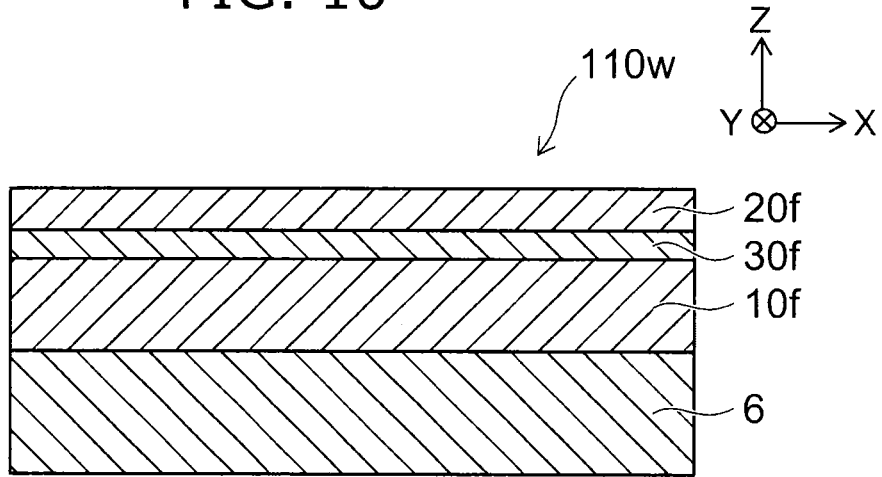
FIGS. 11A and 11B are schematic sectional views illustrating the method for manufacturing a semiconductor light emitting device according to the embodiment.
Figure 11B:
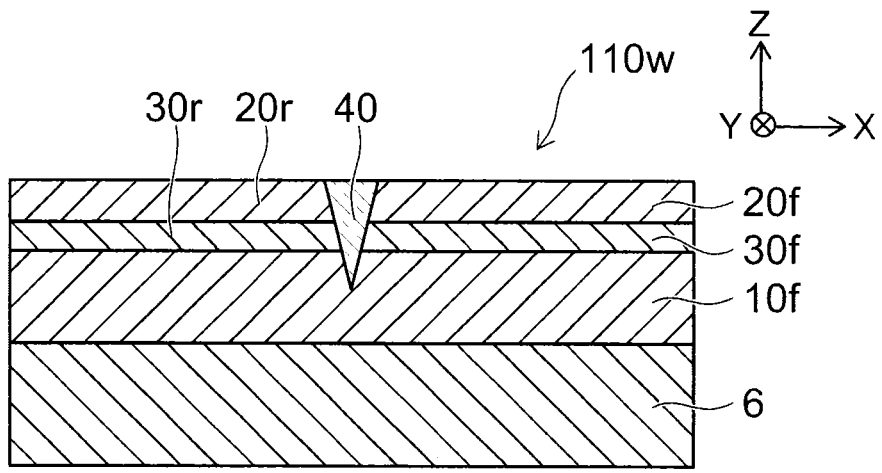

FIGS. 11A and 11B are schematic sectional views illustrating the method for manufacturing a semiconductor light emitting device according to the embodiment.

As shown in FIG. 10, the method for manufacturing a semiconductor light emitting device according to the embodiment includes the step S110 of preparing a workpiece 110w and the step S120 of forming an optical path control section 40 in the workpiece 110w.

As shown in FIG. 11A, the workpiece 110w includes a growth substrate 6 (substrate), a first semiconductor film 10f of the first conductivity type constituting a first semiconductor layer 10, a second semiconductor film 20f of the second conductivity type constituting a second semiconductor layer 20, and a light emitting film 30f constituting a light emitting layer 30. The first semiconductor film 10f is provided on the growth substrate 6 (substrate). The light emitting film 30f is provided on the first semiconductor film 10f. The second semiconductor film 20f is provided on the light emitting film 30f.

The step S110 of preparing a workpiece 110w is a step for forming a workpiece 110w by e.g. forming the first semiconductor film 10f on the growth substrate 6, forming the light emitting film 30f on the first semiconductor film 10f, and forming the second semiconductor film 20f on the light emitting film 30f. Alternatively, the step S110 of preparing a workpiece 110w may be a step for setting a previously formed workpiece 110w on e.g. a manufacturing apparatus for forming an optical path control section 40.

As shown in FIG. 11B, the formation of an optical path control section 40 forms an insulative optical path control section 40. The optical path control section 40 extends along the Z-axis direction, and penetrates through the second semiconductor film 20f and the light emitting film 30f. The refractive index of the optical path control section 40 is lower than the refractive index of the first semiconductor film 10f, the refractive index of the second semiconductor film 20f, and the refractive index of the light emitting film 30f. The optical path control section 40 is surrounded with a first region 20r of the second semiconductor film 20f as projected on the X-Y plane. Furthermore, the optical path control section 40 is surrounded with a second region 30r of the light emitting film 30f as projected on the X-Y plane.

After forming the optical path control section 40 in the workpiece 110w, formation of electrodes, dicing and the like are performed. Thus, a semiconductor light emitting device 110 is formed from the workpiece 110w.

Accordingly, a semiconductor light emitting device 110 having high light extraction efficiency is manufactured.

The light extraction structure based on the optical path control section 40 according to this embodiment is easily applicable to manufacturing processes for the existing flip-chip structure and thin-film structure. This can be realized by adding several steps.

Figure 12A:
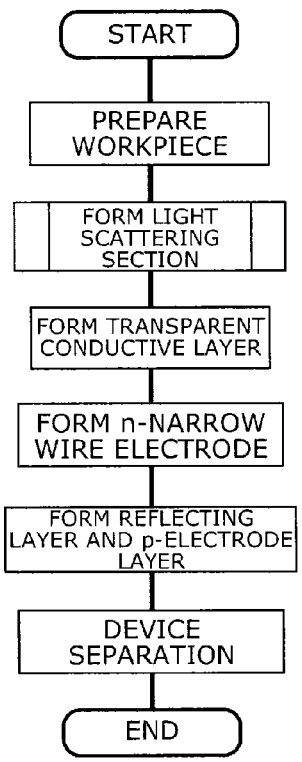
FIGS. 12A to 12C are flow charts illustrating methods for manufacturing a semiconductor light emitting device according to the embodiment.
Figure 12B:
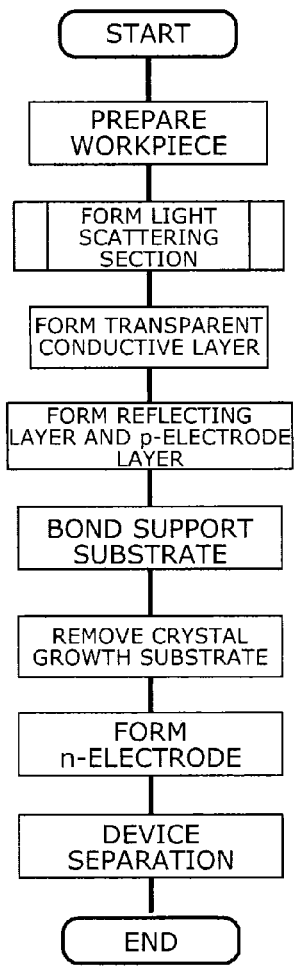
Figure 12C:
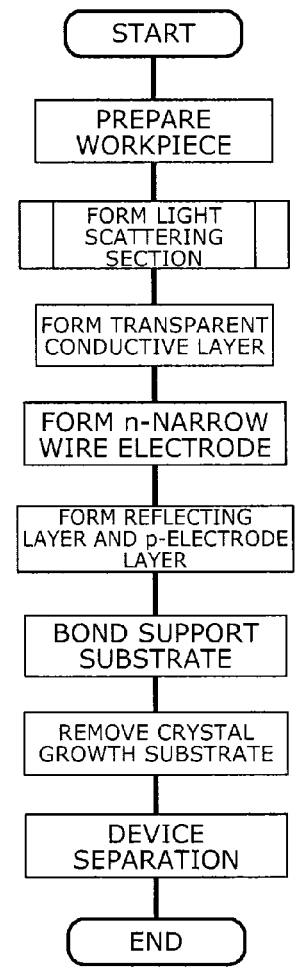

FIGS. 12A to 12C are flow charts illustrating methods for manufacturing a semiconductor light emitting device according to the embodiment.

FIG. 12A illustrates a manufacturing method in the case of applying a flip-chip structure to the semiconductor light emitting device 110 according to this embodiment.

FIG. 12B illustrates a manufacturing method in the case of applying a vertical conduction thin-film structure to the semiconductor light emitting device 110 according to this embodiment.

FIG. 12C illustrates a manufacturing method in the case of applying a horizontal conduction thin-film structure to the semiconductor light emitting device 110 according to this embodiment.

As shown in FIGS. 12A to 12C, manufacturing of the semiconductor light emitting device 110 according to this embodiment can be realized by providing a process for forming an optical path control section 40 in an early step. Here, the process for forming a transparent conductive layer can be omitted, and may be provided as necessary. Furthermore, the order of the process for forming a transparent conductive layer and the process for forming an optical path control section 40 may be reversed.

FIGS. 13A to 13D are a flow chart and schematic sectional views illustrating a method for manufacturing part of the semiconductor light emitting device according to the embodiment.

FIGS. 13A to 13D show an example of the method for forming an optical path control section 40.

Figure 13A:
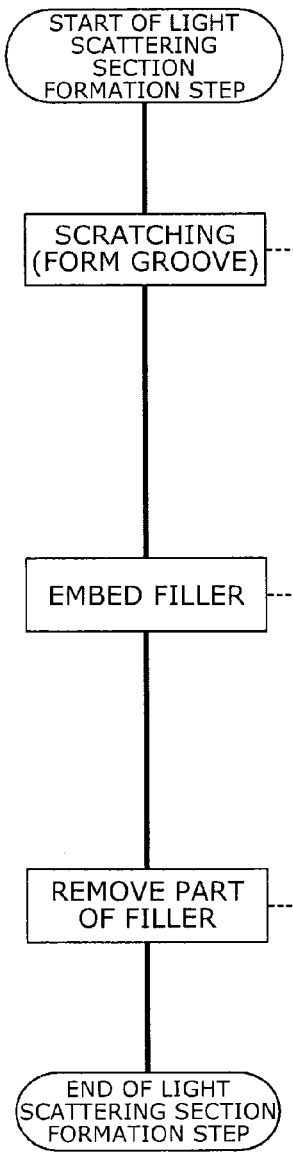
FIGS. 13A to 13D are a flow chart and schematic sectional views illustrating a method for manufacturing part of the semiconductor light emitting device according to the embodiment.
Figure 13B:
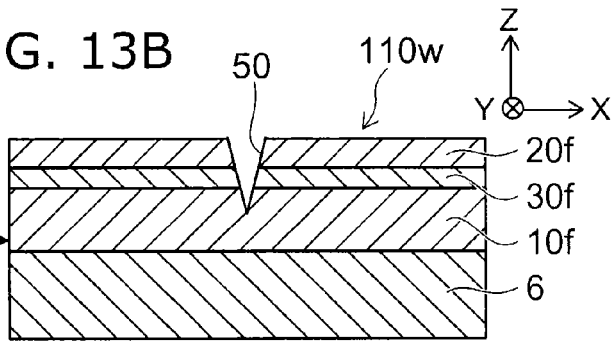

As shown in FIGS. 13A and 13B, in the formation of an optical path control section 40, a groove 50 is formed in the workpiece 110w. The groove 50 extends along the Z-axis direction, and penetrates through the second semiconductor film 20f and the light emitting film 30f. For instance, the width in one direction perpendicular to the Z-axis direction of the groove 50 continuously decreases in the direction from the second semiconductor film 20f toward the first semiconductor film 10f. In this example, the width in the X-axis direction of the groove 50 continuously decreases. The shape of the groove 50 conforms to e.g. the aforementioned shape of the optical path control section 40. In this example, the groove 50 is formed by scratching. Examples of scratching include mechanical technique and laser ablation technique.

Figure 13C:
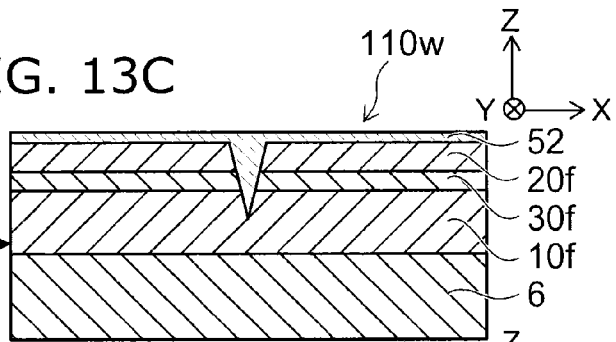

As shown in FIGS. 13A and 13C, a filler 52 is embedded in the groove 50. The refractive index of the filler 52 is lower than the refractive index of the first semiconductor film 10f, the refractive index of the second semiconductor film 20f, and the refractive index of the light emitting film 30f. The material of the filler 52 may be e.g. a stable insulator having low refractive index and low absorption. The filler 52 is made of e.g. a dielectric, a sol-gel material such as SOG, and microparticles as small as being well packed in the groove 50. The filler 52 including a dielectric is formed by e.g. sputtering, evaporation, and CVD technique.

Figure 13D:
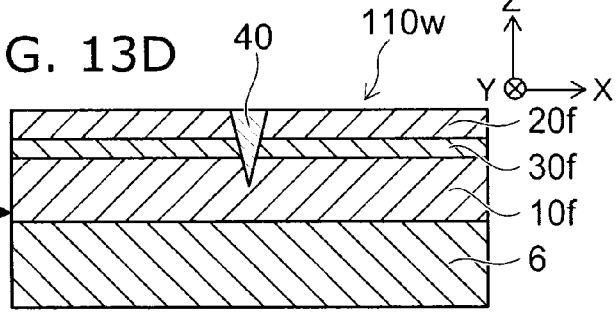

As shown in FIGS. 13A and 13D, part of the filler 52 is removed. Thus, an optical path control section 40 is formed in the workpiece 110w.

The removal of part of the filler 52 is based on e.g. etching, polishing and the like using the difference in the thickness of the filler 52 between in the portion of the groove 50 and in the other portion. Here, the removal of part of the filler 52 may be impossible depending on the method for embedding the filler 52 in the previous step. For instance, part of the filler 52 can be appropriately removed in the case where the filler 52 is embedded by sol-gel technique, or a smooth film formation process such as back-sputtering technique and specially conditioned CVD technique.

FIGS. 14A to 14F are schematic partial sectional views showing part of the semiconductor light emitting device according to the embodiment.

FIGS. 14A to 14F show an example of the cross-sectional shape of the optical path control section 40 formed by the method shown in FIGS. 13A to 13D.

Figure 14A:
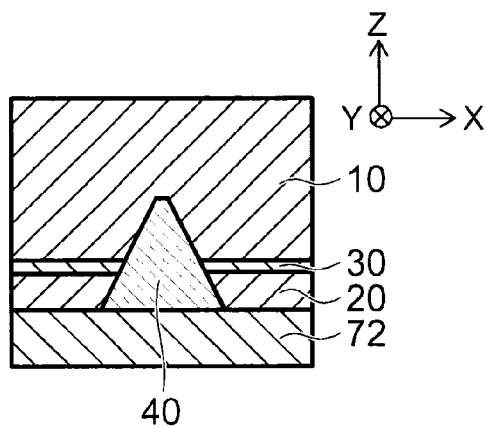
FIGS. 14A to 14F are schematic partial sectional views showing part of the semiconductor light emitting device according to the embodiment.
Figure 14D:
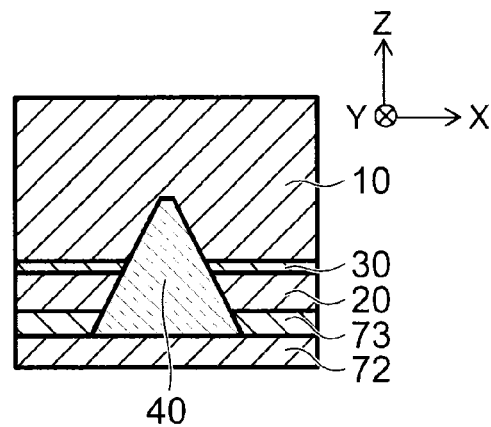
Figure 14B:
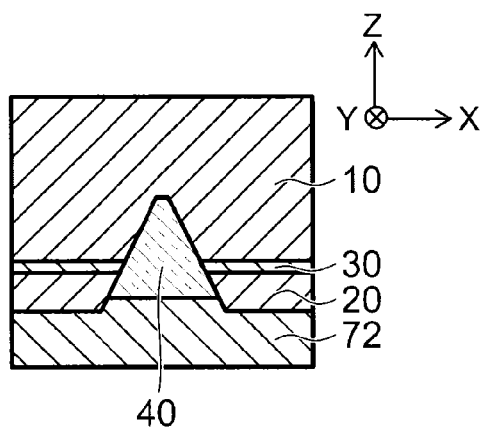
Figure 14E:
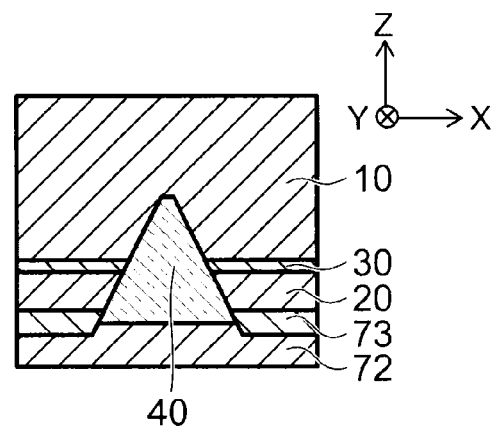
Figure 14C:
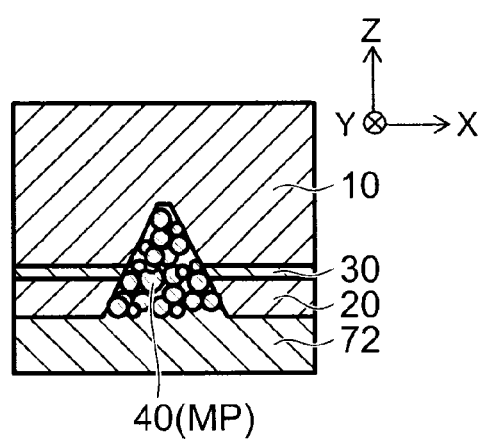
Figure 14F:
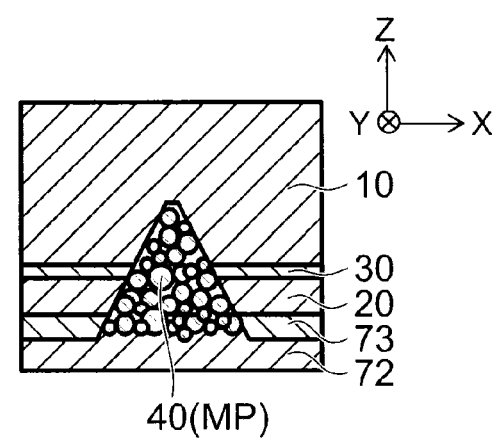

FIGS. 14C and 14F show an example using microparticles MP for the filler 52.

In FIGS. 14D to 14F, a transparent conductive layer 73 is provided between the second semiconductor layer 20 and the second electrode 72. This transparent conductive layer 73 can be formed by e.g. forming a film constituting a transparent conductive layer 73 on the second semiconductor film 20f and then forming an optical path control section 40. As described above, the formation of the transparent conductive layer 73 may be performed after the formation of the optical path control section 40. In this case, the transparent conductive layer 73 extends also between the optical path control section 40 and the second electrode 72. The transparent conductive layer 73 is made of e.g. ITO.

FIGS. 15A to 15F are a flow chart and schematic sectional views illustrating an alternative method for manufacturing part of the semiconductor light emitting device according to the embodiment.

FIGS. 15A to 15F show an alternative method for forming the optical path control section 40.

Figure 15A:
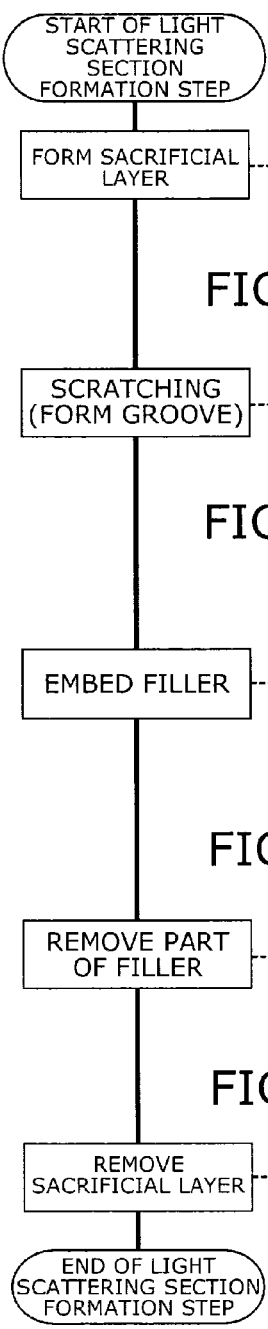
FIGS. 15A to 15F are a flow chart and schematic sectional views illustrating an alternative method for manufacturing part of the semiconductor light emitting device according to the embodiment.
Figure 15B:
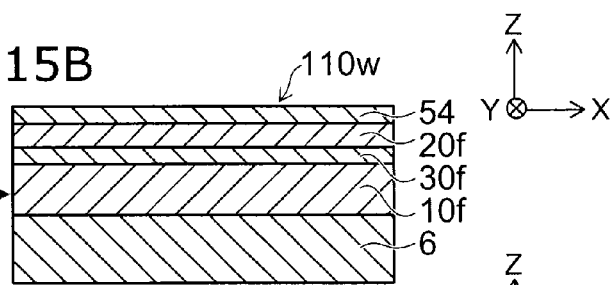

As shown in FIGS. 15A and 15B, in this example, a sacrificial layer 54 is formed on the second semiconductor film 20f. The sacrificial layer 54 is made of e.g. organic resin.

Figure 15C:
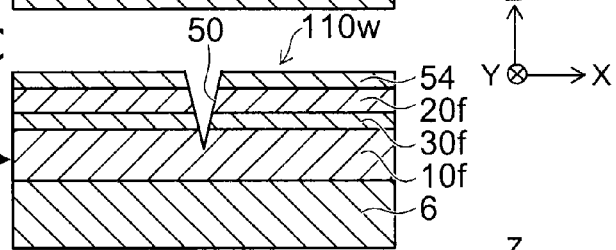

As shown in FIGS. 15A and 15C, a groove 50 is formed by scratching. In this example, the groove 50 penetrates also through the sacrificial layer 54.

Figure 15D:
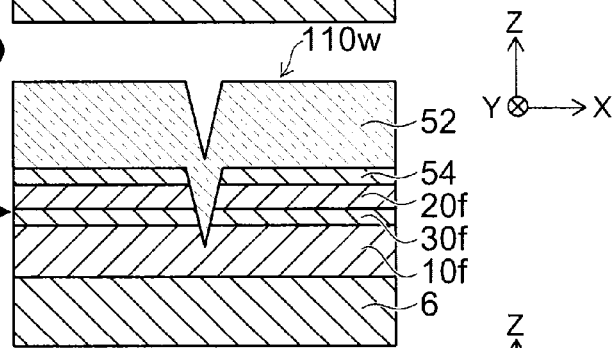

As shown in FIGS. 15A and 15D, a filler 52 is embedded in the groove 50. For instance, the filler 52 is stacked to a thickness completely filling the groove 50.

Figure 15E:
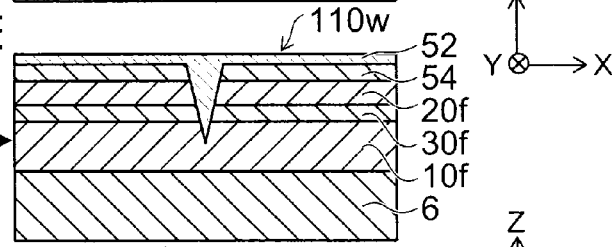

As shown in FIGS. 15A and 15E, part of the filler 52 is removed by etching, polishing and the like.

Figure 15F:
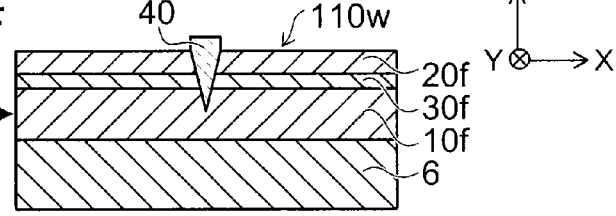

As shown in FIGS. 15A and 15F, the sacrificial layer 54 is removed (lift-off). Thus, only the portion of the filler 52 embedded in the groove 50 remains. Accordingly, an optical path control section 40 is formed in the workpiece 110w. Thus, in the method using lift-off of the sacrificial layer 54, the number of process steps is increased, such as being necessary to form a sacrificial layer 54 in advance. However, a process independent of the method for embedding the filler 52 can be realized.

FIGS. 16A to 16D are schematic partial sectional views showing part of the semiconductor light emitting device according to the embodiment.

Figure 16A:
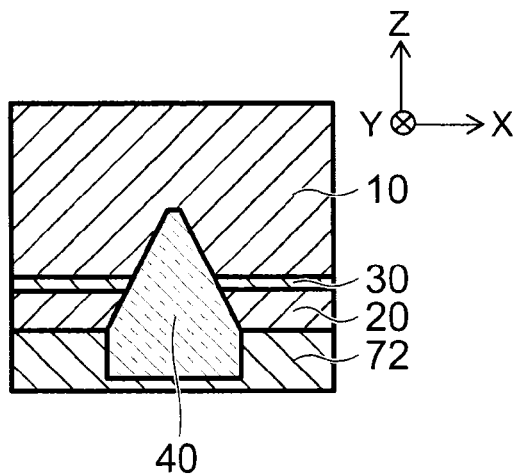
FIGS. 16A to 16D are schematic partial sectional views showing part of the semiconductor light emitting device according to the embodiment.
Figure 16C:
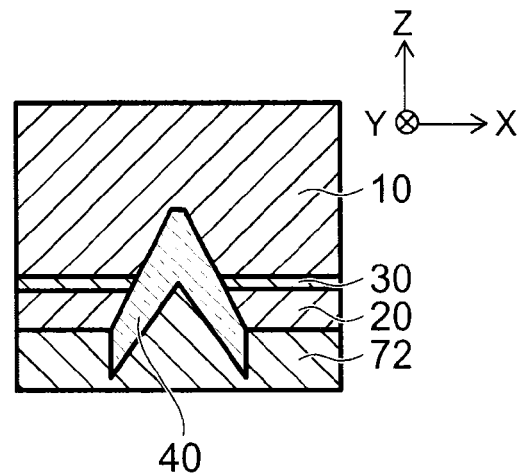
Figure 16B:
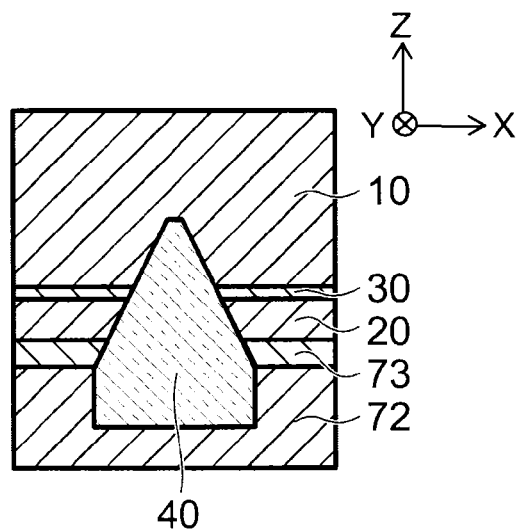

FIGS. 16A and 16B show an example of the cross-sectional shape of the optical path control section 40 formed by the method shown in FIGS. 15A to 15F.

Figure 16D:
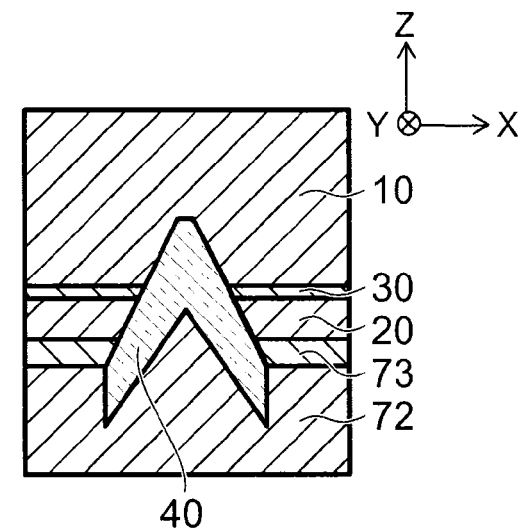

FIGS. 16C and 16D show an example of the cross-sectional shape of the optical path control section 40 in the case of omitting the step of removing part of the filler 52 in the method shown in FIGS. 15A to 15F. For instance, when the filler 52 is embedded in the groove 50, the filler 52 is stacked to a thickness not completely filling the groove 50. Subsequently, the sacrificial layer 54 is removed. Thus, the optical path control section 40 having a cross-sectional shape shown in FIGS. 16C and 16D is removed. Accordingly, in the method using the sacrificial layer 54, the step of removing part of the filler 52 can be omitted.

FIGS. 17A to 17D are a flow chart and schematic sectional views illustrating an alternative method for manufacturing part of the semiconductor light emitting device according to the embodiment.

FIGS. 17A to 17D show an alternative method for forming the groove 50.

As shown in FIGS. 17A and 17B, in this example, a mask layer 56 is formed on the second semiconductor film 20f. In the mask layer 56, a prescribed pattern 56p is formed. The mask layer 56 can be formed by e.g. photolithography processing and etching processing.

As shown in FIGS. 17A and 17C, the workpiece 110w is etched using the mask layer 56 as a mask. A groove 50 is formed by transferring the pattern 56p of the mask layer 56 to the workpiece 110w. For instance, for the mask layer 56, a gray scale mask is used. Thus, a groove 50 having a gradually narrowed width can be favorably formed. The etching of the workpiece 110w may be either dry etching or wet etching.

As shown in FIGS. 17A and 17D, the mask layer 56 is removed. Subsequently, as described above, by performing processes such as embedding a filler 52, an optical path control section 40 can be formed as in the case of scratching. In this technique, the number of process steps is increased. However, this technique is conventional, and has high controllability and uniformity. Thus, it is easy to form an optical path control section 40 with intended structure and arrangement.

The method for forming a groove by etching is also applicable to the method for forming an optical path control section 40 based on lift-off of the sacrificial layer 54 by providing a sacrificial layer 54 between the second semiconductor film 20f and the mask layer 56 and etching also the sacrificial layer 54.

FIGS. 18A to 18E are a flow chart and schematic sectional views illustrating an alternative method for manufacturing part of the semiconductor light emitting device according to the embodiment.

FIGS. 18A to 18E show an alternative method for forming the optical path control section 40.

As shown in FIGS. 18A and 18B, in this example, a protective layer 58 is formed on the second semiconductor film 20f. The protective layer 58 is made of a material resistant to the composition modification processing described later. The protective layer 58 is made of e.g. $SiO_2$.

As shown in FIGS. 18A and 18C, the protective layer 58 is patterned by e.g. photolithography processing and etching processing. Thus, a pattern 58p is formed in the protective layer 58. That is, the portion of the workpiece 110w to be modified in composition is exposed.

As shown in FIGS. 18A and 18D, composition modification processing is performed on the workpiece 110w. The composition modification processing is a processing for partially converting GaN to $Ga_2O_3$ by decoupling nitrogen of GaN and coupling oxygen instead. By the composition modification processing, the composition of only the portion of the workpiece 110w exposed from the protective layer 58 is modified.

As shown in FIGS. 18A and 18E, the protective layer 58 is removed. Thus, an optical path control section 40 is formed in the workpiece 110w. This technique is considered to be currently difficult for GaN-based material. However, it is very useful if realized. This technique can be favorably used to manufacture e.g. a semiconductor light emitting device 110 including AlGaN-based material in the stacked body SB.

Figure 19A:
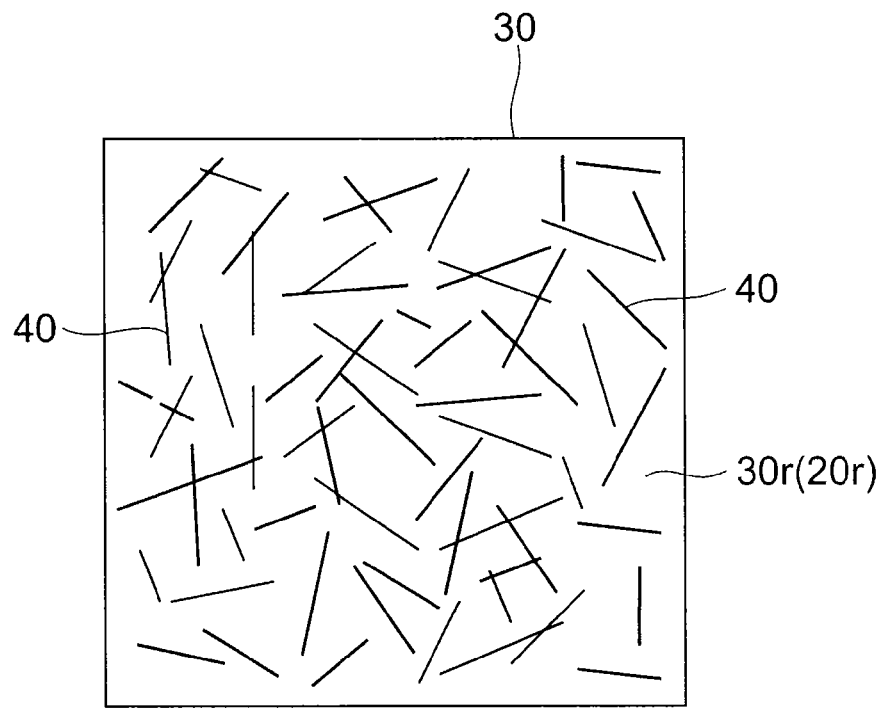
FIGS. 19A and 19B are schematic plan views showing part of alternative semiconductor light emitting devices according to the embodiment.
Figure 19B:
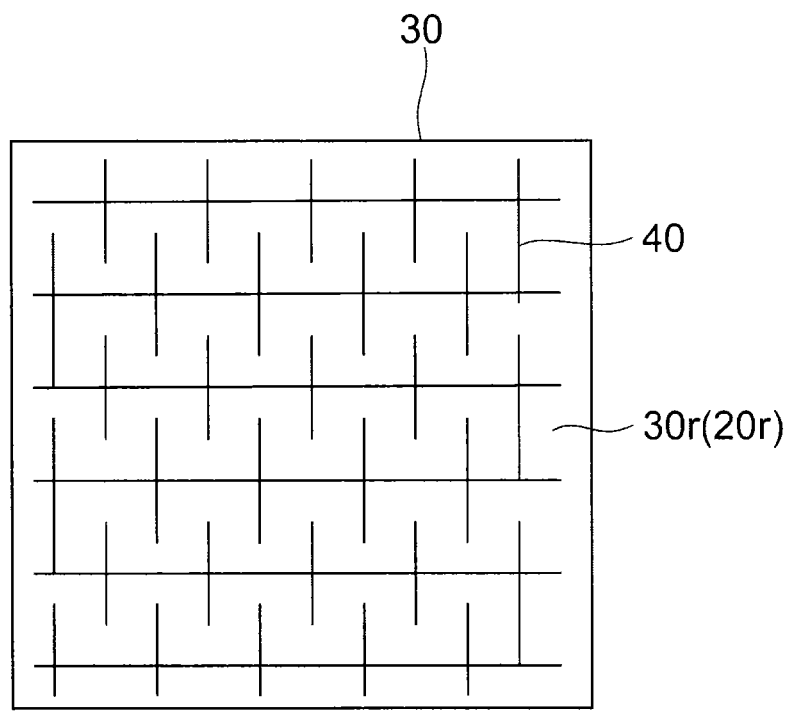

FIGS. 19A and 19B are schematic plan views showing part of alternative semiconductor light emitting devices according to the embodiment.

In FIGS. 19A and 19B, the first semiconductor layer 10 and the first electrode 71 are not shown.

As shown in FIG. 19A, a plurality of optical path control sections 40 may be arranged randomly.

Alternatively, as shown in FIG. 19B, one linear optical path control section 40 curved or kinked in arbitrary directions may be formed entirely in the light emitting layer 30.

Also in the example shown in FIG. 19A, the first region 20r and the second region 30r surround each of the plurality of optical path control sections 40. Furthermore, also in the example shown in FIG. 19B, the first region 20r and the second region 30r surround the optical path control section 40. Thus, electric charges can migrate more easily in the light emitting layer 30. This can enhance e.g. the in-plane uniformity of brightness of the light emitting layer 30.

In the semiconductor light emitting device 110 according to this embodiment, detailed investigations have been performed on where the generated photons are lost and to what extent they can be extracted outside depending on the polarization and propagation direction thereof. As a result, it is found that the light extraction efficiency can be increased by arranging a light scattering structure having a lower refractive index than the stacked body SB so as to penetrate through the light emitting layer 30. For instance, the internally propagating light can be efficiently scattered without the increase of light absorption. Furthermore, in the semiconductor light emitting device 110 according to this embodiment, the remove ratio of the light emitting layer 30 can also be suppressed.

Practical Example

In the following, an example of application to a nitride semiconductor light emitting device based on the thin-film structure is described.

In the semiconductor light emitting device 110, typically, immediately after crystal growth, a thin second semiconductor film 20f exists on the uppermost surface of the wafer. A light emitting film 30f exists below the second semiconductor film 20f. The deepest portion of the light emitting film 30f as viewed from the surface is typically suppressed to approximately 100-500 nm due to e.g. the restriction of the crystal growth technique. In this surface, a groove 50 shaped like a wedge is formed. The groove 50 has a width of 300 nm to 3 μm. The depth of the groove 50 is deeper than the aforementioned deepest portion of the light emitting film by ¼ or more of the emission wavelength. In this case, preferably, the cross section of the groove 50 has a V-shape narrowed with the depth. The bottom angle thereof is preferably in the range of 30-120°. More preferably, the bottom angle is 60-90°. However, the bottom does not need to make an acute angle, but may be U-shaped. The functionality remains unchanged even if the bottom is flat and has a certain width. However, this increases the decrease amount of the light emitting layer 30. Thus, the bottom width is preferably as narrow as possible.

The groove 50 is arbitrary in length, arrangement method, and shape such as straight or curved, and line segment or not. For instance, grooves 50 having a length of several ten μm are regularly arranged. Then, the device structure as shown in FIGS. 1A and 1B can be obtained. The arrangement of the optical path control section 40 may be based on the configurations shown in FIGS. 19A and 19B. The method for arranging the optical path control section 40 can be arbitrary in view of the manufacturing process and the device configuration as long as the condition described below is satisfied.

As a common condition, preferably, the optical path control section 40 is arranged almost entirely. Furthermore, everywhere on the light emitting layer 30, the distance to the nearest groove is preferably smaller than the shorter of 20 times the thickness of the stacked body SB after the formation of the light emitting device, and $-\ln(0.5)/\alpha$, where $\alpha$ is the average light absorptance of the light emitting layer 30. For instance, the final thickness of the stacked body SB of the light emitting device is 4 μm. Then, the grooves 50 are arranged with a spacing of at most 160 μm. On the other hand, if $\alpha=100$ cm$^{-1}$, the grooves 50 are arranged with a spacing of 140 μm or less.

It is not desirable that the light emitting layer 30 be completely separated as a small domain (region) by the optical path control section 40. This is because, for instance, even if carrier overflow occurs in one domain, there is no chance to supply excessive carriers to adjacent domains. However, such a situation is sufficiently possible depending on the crystal quality and the manufacturing process. On the other hand, an LED structure with high carrier diffusion based on the HEMT structure is also proposed. Also in order to utilize such mechanisms, preferably, each domain has a certain continuous size.

Furthermore, before this groove formation processing, a transparent conductive layer 73 made of e.g. ITO or SnO may be stacked to a length of half or more of the emission wavelength, or 200 nm or more, and the groove 50 may be formed collectively therewith. This is advantageous in increasing the tolerance for removing part of the filler 52, and being capable of suppressing the absorption loss due to the light reflecting layer RL. However, in view of light absorption of the transparent conductive layer 73, the extinction coefficient (the imaginary part of the complex refractive index) of the transparent conductive layer 73 is preferably smaller than 0.01.

After forming the groove 50, a dielectric having a sufficiently lower refractive index than the semiconductor portion is embedded and sealed in the groove 50. The embedding method is arbitrary. For instance, the embedding method can be based on application of liquid glass (see FIG. 14A), or lift-off by a mask used in the groove formation process after film formation of the dielectric layer (see FIGS. 16A to 16D). Alternatively, the optical path control section 40 may be a void if it is possible to form a structure (e.g., membrane structure) avoiding short circuit of the p-n junction in the subsequent formation of the second electrode 72.

After sealing the groove 50, a second electrode 72 is formed. The second electrode 72 is arbitrary in kind as long as the reflectance of the second electrode 72 is sufficiently high for the emission wavelength. However, in the case where the optical path control section 40 is formed by the aforementioned lift-off process, the optical path control section 40 may be significantly projected from the film surface of the second semiconductor layer 20. Thus, preferably, the second electrode 72 is formed with a thickness enough to avoid step discontinuity (e.g., 100 nm or more and 2 μm or less). Subsequently, the conventional thin-film formation process is performed to form a semiconductor light emitting device 110 having the thin-film structure.

A simulation result is now presented in the case of a typical structure of the optical path control section 40 with the angle θs set to 90°, the penetration depth Dp set to 300 nm, and the material being $SiO_2$.

Figure 20A:
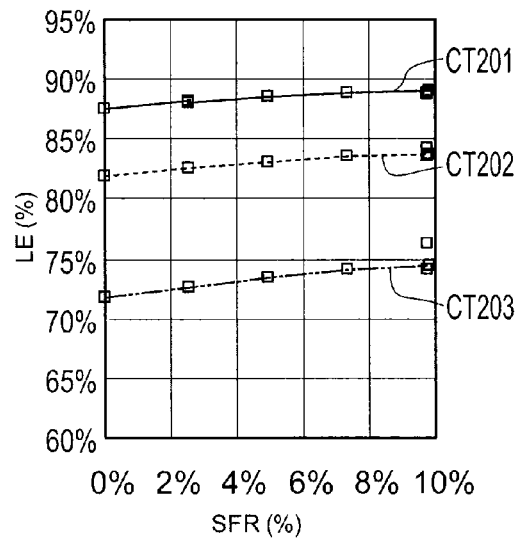
FIGS. 20A to 20C are graphs illustrating the result of the simulation of the semiconductor light emitting device according to the embodiment.
Figure 20B:
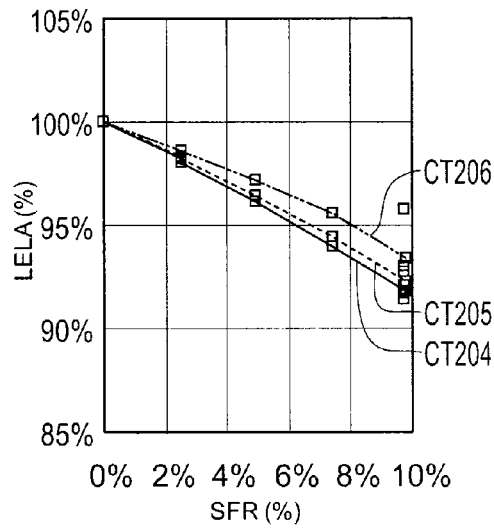
Figure 20C:
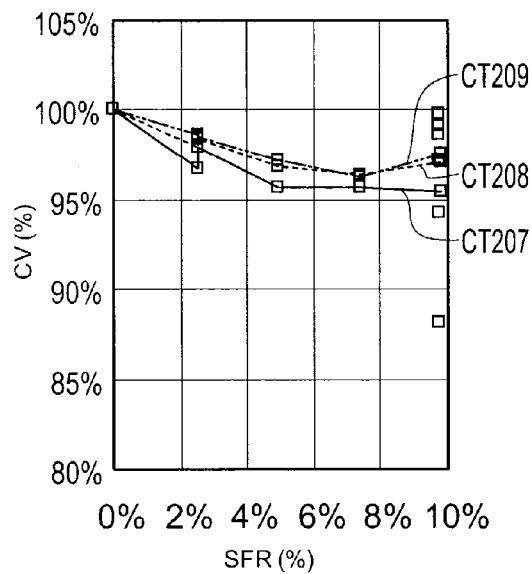

FIGS. 20A to 20C are graphs illustrating the result of the simulation of the semiconductor light emitting device according to the embodiment.

The horizontal axis of FIGS. 20A to 20C represents the filling ratio SFR (%) of the optical path control section 40. The vertical axis of FIG. 20A represents the light extraction efficiency LE (%). The vertical axis of FIG. 20B represents the product LELA (%) of the light extraction efficiency and the light emission area. The vertical axis of FIG. 20C represents the relative value CV (%) of the amount of heat generation.

In FIG. 20A, characteristic CT201 is a simulation result under the condition of TE-like emission. In FIG. 20A, characteristic CT203 is a simulation result under the condition of TM-like emission. In FIG. 20A, characteristic CT202 is a simulation result under the condition of isotropic emission. In FIG. 20B, characteristic CT204 is a simulation result under the condition of TE-like emission. In FIG. 20B, characteristic CT206 is a simulation result under the condition of TM-like emission. In FIG. 20B, characteristic CT205 is a simulation result under the condition of isotropic emission. In FIG. 20C, characteristic CT207 is a simulation result under the condition of TE-like emission. In FIG. 20C, characteristic CT209 is a simulation result under the condition of TM-like emission. In FIG. 20C, characteristic CT208 is a simulation result under the condition of isotropic emission.

As shown in FIGS. 20A to 20C, the simulation results are shown with reference to the proportion of the optical path control section 40 occupied in the wafer, i.e., the remove ratio of the light emitting layer 30. A higher remove ratio indicates that the optical path control section 40 is denser.

FIG. 20A shows pure light extraction. At a remove ratio of 10%, among the light emission components, the TE-like component is increased by approximately 2%, and the TM-like component is increased by a little less than 4%. In all the light components, the increase is approximately 3%.

FIG. 20B shows the product of the light extraction efficiency and the area of the light emitting layer 30. The value of 100% represents the case where there is no structure of the optical path control section 40. This figure indicates that the increase of efficiency is not larger than the remove of the light emitting layer 30. However, for instance, in the method for dividing the light emitting layer 30 into a plurality of regions, even if the extraction efficiency is 100%, the remove ratio of the light emitting layer 30 is less than 64%. Thus, it is found that the semiconductor light emitting device 110 according to this embodiment has a low remove ratio of the light emitting layer 30.

FIG. 20C shows the amount of heat generation due to light absorption loss in obtaining the same amount of light emission. This indicates that the light extraction efficiency is important. As shown in FIG. 20C, in the semiconductor light emitting device 110 according to this embodiment, compared with the case where there is no structure of the optical path control section 40, several % of heat generation suppression can be expected. Here, the best balanced situation is realized when the remove ratio of the light emitting layer 30 is 4-10%.

As described above, the embodiment provides a semiconductor light emitting device having high light extraction efficiency and a method for manufacturing the same.

In this specification, the "nitride semiconductor" includes semiconductors of the chemical formula $B_x In_y Al_z Ga_{1-x-y-z} N$ ($0 \leq x \leq 1$, $0 \leq y \leq 1$, $0 \leq z \leq 1$, $x+y+x \leq 1$) of any compositions with the composition ratios x, y, and z varied in the respective ranges. Furthermore, the "nitride semiconductor" also includes those of the above chemical formula further containing group V elements other than N (nitrogen), those further containing various elements added to control various material properties such as conductivity type, and those further containing various unintended elements.

In this specification, "perpendicular" and "parallel" mean not only being exactly perpendicular and exactly parallel, but include, for instance, variations in the manufacturing process, and only need to mean substantially perpendicular and substantially parallel. In this specification, the state of being "provided on" includes not only the state of being provided in direct contact, but also the state of being provided with another element interposed in between. The state of being "stacked" includes not only the state of being stacked in contact with each other, but also the state of being stacked with another element interposed in between. The state of being "opposed" includes not only the state of directly facing, but also indirectly facing with another element interposed in between.

The embodiments of the invention have been described above with reference to examples. However, the embodiments of the invention are not limited to these examples. For instance, any specific configurations of various components such as the first semiconductor layer, second semiconductor layer, light emitting layer, stacked body, optical path control section, first region, second region, light reflecting layer, first semiconductor film, second semiconductor film, light emitting film, workpiece, groove, filler, sacrificial layer, and mask layer included in the semiconductor light emitting device are encompassed within the scope of the invention as long as those skilled in the art can similarly practice the invention and achieve similar effects by suitably selecting such configurations from conventionally known ones.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
    a stacked body including:
        a first semiconductor layer of a first conductivity type;
        a second semiconductor layer of a second conductivity type; and
        a light emitting layer provided between the first semiconductor layer and the second semiconductor layer,
    the first semiconductor layer, the second semiconductor layer, and the light emitting layer being stacked along a stacking direction; and
    a plurality of optical path control sections penetrating through the second semiconductor layer and the light emitting layer, the optical path control sections being insulative and each having a refractive index lower than a refractive index of the first semiconductor layer, a refractive index of the second semiconductor layer, and a refractive index of the light emitting layer, the optical path control sections being configured to change a traveling direction of a light emitted from the light emitting layer; and
    a light reflecting layer electrically connected to the second semiconductor layer, the second semiconductor layer being provided between the light emitting layer and the light reflecting layer, a reflectance of the light reflecting layer being higher than a reflectance of the second semiconductor layer, the light reflecting layer not overlapping with the stacked body in a direction perpendicular to the stacking direction, each of the optical path control sections having a line shape when projected on a plane perpendicular to the stacking direction, an extending direction of an one of the optical path control sections being different from an extending direction of another one of the optical path control sections, and the second semiconductor layer and the light emitting layer being continuous in the plane.

2. The device according to claim 1, wherein as projected on the plane, length in extending direction of the optical path control section shaped like the line is 5 times or more of length in a direction perpendicular to the extending direction of the optical path control section shaped like the line.

3. The device according to claim 1, wherein width of each optical path control section in a direction perpendicular to the stacking direction continuously decreases in a direction from the second semiconductor layer toward the first semiconductor layer.

4. The device according to claim 3, wherein maximum of the width of each optical path control section is larger than or equal to wavelength of the light and twice or less of length along the stacking direction of the second semiconductor layer.

5. The device according to claim 1, wherein length along the stacking direction of the second semiconductor layer is thinner than length along the stacking direction of the first semiconductor layer.

6. The device according to claim 1, wherein
the first semiconductor layer has a first surface opposed to the light emitting layer and a second surface on opposite side from the first surface, and
absolute value of difference between distance along the stacking direction between the second surface and the optical path control section, and distance along the stacking direction between the second surface and the light emitting layer, is longer than half of wavelength of the light.

7. The device according to claim 1, wherein length along the stacking direction of the optical path control section is 3 times or more of wavelength of the light.

8. The device according to claim 1, wherein
the optical path control section has a side surface non-parallel to the stacking direction, and
angle between the side surface and a plane perpendicular to the stacking direction is 30° or more and 60° or less.

9. The device according to claim 1, wherein area of the optical path control section projected on a plane perpendicular to the stacking direction is 10% or less of area of outer shape of the light emitting layer projected on the plane.

10. The device according to claim 1, wherein as projected on a plane perpendicular to the stacking direction, distance between two adjacent ones of the optical path control sections is 20 times or less of length of the stacked body along the stacking direction.

11. The device according to claim 1, wherein as projected on a plane perpendicular to the stacking direction, distance between an end portion of the light emitting layer and one of the optical path control sections adjacent to the end portion is 20 times or less of length of the stacked body along the stacking direction.

12. The device according to claim 1, wherein the optical path control sections are arranged randomly.

* * * * *